US006911843B2

(12) United States Patent
Mizumoto et al.

(10) Patent No.: US 6,911,843 B2
(45) Date of Patent: Jun. 28, 2005

(54) DATA TRANSFER DEVICE FOR TRANSFERRING DATA BETWEEN BLOCKS OF DIFFERENT CLOCK DOMAINS

(75) Inventors: Katsuya Mizumoto, Tokyo (JP); Hiroshi Shirota, Tokyo (JP); Ryosuke Okuda, Tokyo (JP); Kazuaki Tanida, Hyogo (JP)

(73) Assignees: Renesas Technology Corp., Tokyo (JP); Mitsubishi Electric System, Itami (JP); LSI Design Corporation, Itami (JP)

( * ) Notice: Subject to any disclaimer, the term of this patent is extended or adjusted under 35 U.S.C. 154(b) by 45 days.

(21) Appl. No.: 10/352,164

(22) Filed: Jan. 28, 2003

(65) Prior Publication Data

US 2004/0027167 A1 Feb. 12, 2004

(30) Foreign Application Priority Data

Aug. 7, 2002 (JP) ........................................ 2002-230423

(51) Int. Cl.[7] .................. H03K 19/0175; H03K 19/094; H03K 3/00; H03M 9/00; G06F 1/04
(52) U.S. Cl. ........................... 326/86; 327/297; 341/100
(58) Field of Search ............................. 326/86; 327/122, 327/297; 368/113; 369/47.28; 375/373, 372; 377/39; 713/502; 341/100

(56) References Cited

U.S. PATENT DOCUMENTS

| | | | | |
|---|---|---|---|---|
| 4,872,155 A | * | 10/1989 | Yokogawa et al. | 369/47.28 |
| 4,989,223 A | * | 1/1991 | Katayose et al. | 377/39 |
| 5,293,628 A | * | 3/1994 | Langan et al. | 713/502 |
| 5,598,446 A | * | 1/1997 | Van Der Tuijn | 375/373 |
| 6,097,674 A | * | 8/2000 | Swapp | 368/113 |
| 6,259,283 B1 | * | 7/2001 | Nguyen | 327/122 |

FOREIGN PATENT DOCUMENTS

| | | | |
|---|---|---|---|
| EP | 1172960 | * | 1/2002 |
| JP | 2001-268142 | | 9/2001 |

OTHER PUBLICATIONS

"Universal Serial Bus Specification," Revision 2.0, http://www.usb.org/developers/data/usb_20.zip Apr 27, 2000, pp. 157–158.
USB 2.0 Transceiver Macrocell Interface (UTMI) Specification 1999–2001 Intel Corporation, Ver. 1.05, http://developer.intel.com/technology/usb/download/2_0_Xcvr_Macrocell_1_05.pdf Mar. 29, 2001, P23 5.6 Bit Unstuff Logic & Figure 5.
USB 2.0 Transceiver Macrocell Interface (UTMI) Specification 1999–2001 Intel Corporation, Ver. 1.05, http://developer.intel.com/technology/usb/download/ 2_0_Xcvr_Macrocell_1_05.pdf Mar. 29, 2001, P29 5.11 Bitstuff Logic & Figure 11.

* cited by examiner

Primary Examiner—Patrick Wamsley
(74) Attorney, Agent, or Firm—Burns, Doane, Swecker & Mathis, L.L.P.

(57) ABSTRACT

The number of pulses of a clock signal CLK-A is circularly counted in a count range from "0" to "7", and count signals indicating count values are produced. A clock signal CLK-B having a frequency lower than that of the clock signal CLK-A is produced from count signals of "3" and "7", and data transfer between a high speed operating block operated in synchronization with the clock signal CLK-A and a low speed operating block operated in synchronization with the clock signal CLK-B is performed in synchronization with the clock signal CLK-B to receive input serial data or transmit output serial data. When a stuff bit of universal Serial Bus is detected in the input serial data or is inserted in the output serial data, a cycle of the clock signal CLK-B is lengthened by one cycle of the clock signal CLK-A.

15 Claims, 19 Drawing Sheets

SIGNAL LINE NUMBER    SIGNAL LIST IN FIRST EMBODIMENT    FIG.2

| | SIGNAL NAME | POLARITY | FUNCTION |
|---|---|---|---|
| 311 | CLK-A | ↑ | CLOCK SIGNAL This clock signal has a frequency corresponding to a transfer rate of serial data or another frequency higher than the frequency. |
| 312 | CLK-B | ↑ | CLOCK SIGNAL This clock signal is produced in the clock signal producing block 17. Frequency depends on a parallel data width. For example, a frequency of the clock signal CLK-A is equal to 480 MHz, a frequency of the clock signal CLK-B is equal to 60 MHz, and a parallel data width is equal to 8 bits. |
| 323 | SDIN | POSITIVE | INPUT SERIAL DATA RECEIVED THROUGH A SERIAL BUS |
| 324 | SDOUT | POSITIVE | OUTPUT SERIAL DATA TRANSMITTED THROUGH A SERIAL BUS |
| 321 | RxData[7:0] | POSITIVE | RECEPTION PARALLEL DATA HELD IN THE HOLDING REGISTER 11, 21 This data is driven or sampled when the load enable signal Ld-En is set to the high level. A value of the data held in the holding register 11, 21 is sampled in the receiving operation, and a value of transmission parallel data TxData is sampled in the transmitting operation. The reception parallel data is sampled in the low speed operating block 2 in synchronization with each leading edge of the clock signal CLK-B. |
| 322 | TxData[7:0] | POSITIVE | TRANSMISSION PARALLEL DATA OUTPUT TO THE SERIAL BUS 324 AS OUTPUT SERIAL DATA SDOUT This data is output from the low speed operating block 2 and is driven in response to each leading edge of the clock signal CLK-B. |
| 325 | SEL-RX-TX | – | TRANSFER MODE SIGNAL This signal is set to "1" in the receiving operation and is set to "0" in the transmitting operation. |
| 326 | SEL-CNT[2:0] | POSITIVE | ENABLE TIMING SETTING SIGNAL This signal sets an enable timing of the load enable signal Ld-En. A set range is from "0" to "7" of the count value. |
| 327 | SEL-PE[2:0] | POSITIVE | CLK-B LEADING EDGE TIMING SETTING SIGNAL This signal sets a timing of each leading edge of the clock signal CLK-B. A set range is from "0" to "7" of the count value. |
| 328 | SEL-NE[2:0] | POSITIVE | CLK-B TRAILING EDGE TIMING SETTING SIGNAL This signal sets a timing of each trailing edge of the clock signal CLK-B. A set range is from "0" to "7" of the count value. |
| 333 | Cnt | POSITIVE | COUNT SIGNAL This signal denotes a count value of the counter 16. The count value is incremented in a count range from "0" to "7". |
| 352 | Cnt[2] | POSITIVE | COUNT SIGNAL DENOTING A COUNT VALUE "2" When the count value of the counter 16 is equal to "2", the count signal is set to the high level. |
| 353 | Cnt[3] | POSITIVE | COUNT SIGNAL DENOTING A COUNT VALUE "3" When the count value of the counter 16 is equal to "3", the count signal is set to the high level. |
| 356 | Cnt[6] | POSITIVE | COUNT SIGNAL DENOTING A COUNT VALUE "6" When the count value of the counter 16 is equal to "6", the count signal is set to the high level. |
| 357 | Cnt[7] | POSITIVE | COUNT SIGNAL DENOTING A COUNT VALUE "7" When the count value of the counter 16 is equal to "7", the count signal is set to the high level. |
| 361 | Clk-Pos-Edge | POSITIVE | CLK2 LEADING EDGE ENABLE SIGNAL This signal is set to the high level when the count signal Cnt[3] or the count signal selected according to the CLK-B leading edge timing setting signal SEL-PE is set to the high level and the holding signal Hld is set to the low level. In other cases, this signal is set to the low level. |
| 360 | Clk-Neg-Edge | POSITIVE | CLK2 TRAILING EDGE ENABLE SIGNAL This signal is set to the high level when the count signal Cnt[7] or the count signal selected according to the CLK-B trailing edge timing setting signal SEL-NE is set to the high level and the holding signal Hld is set to the low level. In other cases, this signal is set to the low level. |
| 332 | Hld | POSITIVE | HOLD SIGNAL (OR STUFF BIT DETECTING SIGNAL) This signal is set to the high level when six bit-data of SDIN or SDOUT are successively set to the high level. When this signal is set to the low level, previous values are held in the shift register 12 and counter 16. |
| 335 | Sft-Regs[7:0] | POSITIVE | PARALLEL DATA OF 8-BIT SHIFT REGISTER VALUES This signal denotes a value of the shift register 12. |
| 334 | Sft-Regs[0] | POSITIVE | SERIAL DATA OBTAINED FROM THE TRANSMISSION PARALLEL DATA TxData |
| 331 | Ld-En | POSITIVE | LOAD ENABLE SIGNAL When this signal is set to the high level, a value (Sft-Regs[7:0]) of the shift register 12 is fetched in the holding register 11, 21 as RxData[7:0] in the receiving operation, and the transmission parallel data TxData[7:0] transferred from the low speed operating block 2 is fetched in the shift register 21 (or the shift register 12 in the first embodiment) in the transmitting operation. Conditions for setting this signal to the high level are as follows. (1) In the first, fourth and fifth embodiments, the count value "7" signal Cnt[7] is set to the high level, and the holding signal hold set to the low level is sampled. In this case, this signal is set to the high level in the transmitting and receiving operations. In other cases, this signal is set to the low level. (2) In the second embodiment, in the receiving operation, the count value "7" signal Cnt[7] is set to the high level, and the holding signal hold set to the low level is sampled. In this case, this signal is set to the high level. In other cases, this signal is set to the low level. In the transmitting operation, the count value "2" signal Cnt[2] is set to the high level, and the holding signal Hld set to the low level is sampled. In this case, this signal is set to the high level. In other cases, this signal is set to the low level. (3) In the third embodiment, the count value specified by the enable timing setting signal SEL-CNT is set to the high level, and the holding signal Hld set to the low level is sampled. In this case, this signal is set to the high level. In other cases, this signal is set to the low level. |
| 336 | Sft-En | POSITIVE | SHIFT ENABLE SIGNAL This signal is a control signal of the shift register 12. When this signal is set to the high level, a right shift is performed in the shift register 12. When this signal is set to the low level, the output TxData[7:0] of the holding register 21 is held in the shift register 12. This signal is changed to the low level only in the transmitting operation and is always set to the high level in the receiving operation. When the count value "2" signal Cnt[3] is set to the high level and the holding signal Hld set to the low level is sampled, this signal is set to the low level. In other cases, this signal is set to the high level. |

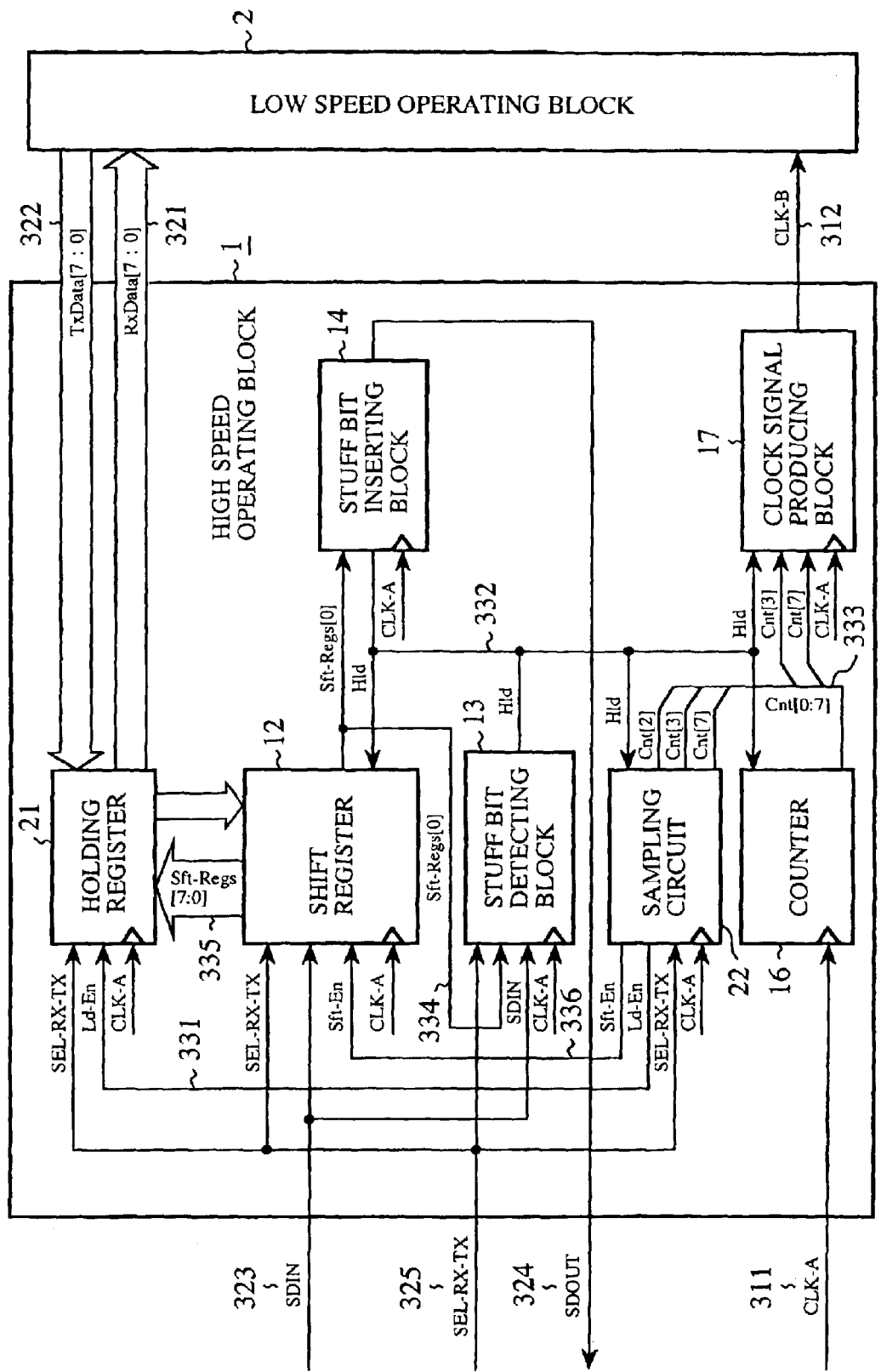

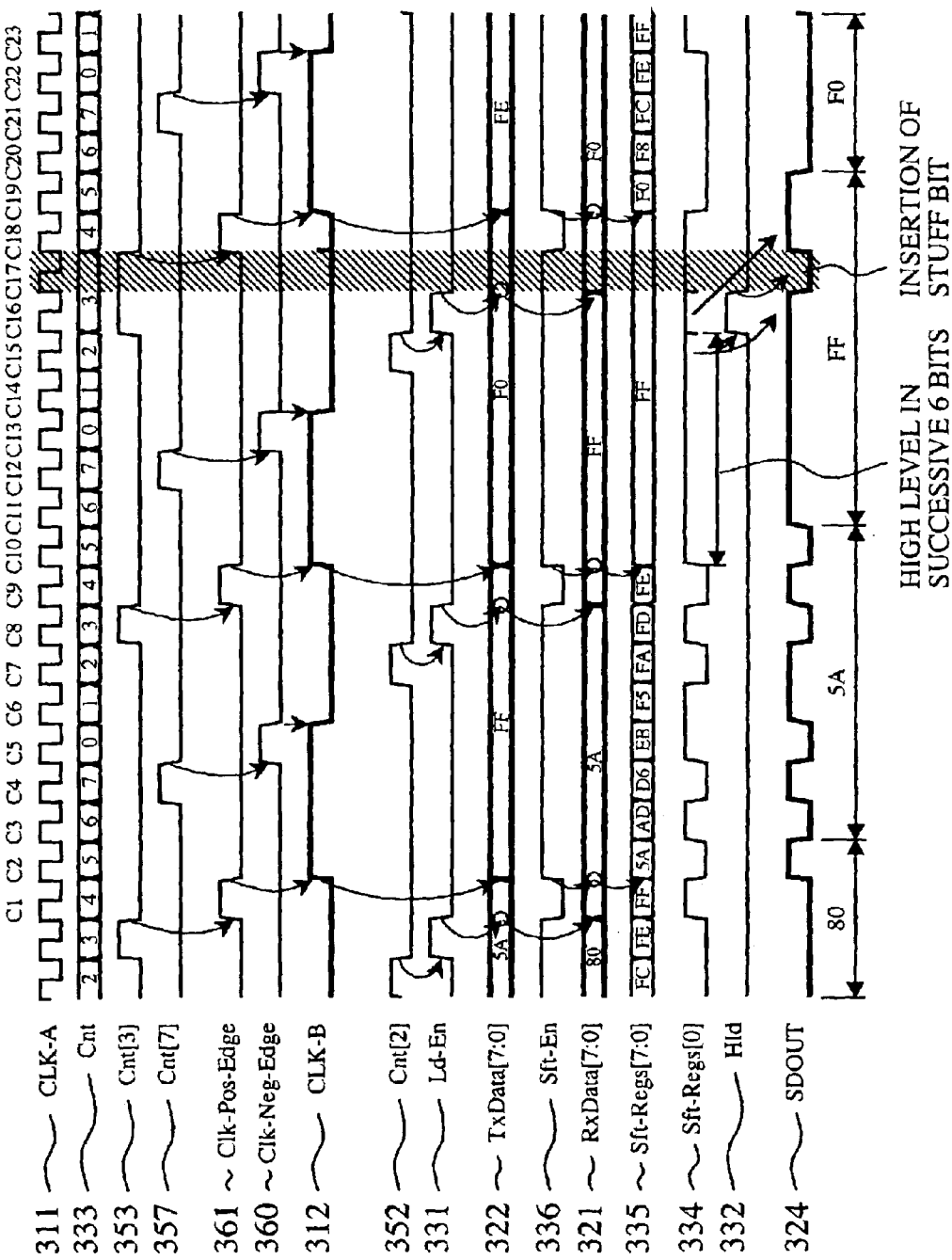

DATA TRANSFER DEVICE FOR TRANSFERRING DATA BETWEEN BLOCKS OF DIFFERENT CLOCK DOMAINS

BACKGROUND OF THE INVENTION

1. Field of the Invention

The present invention relates generally to a data transfer device used for a high speed serial communication apparatus, and more particularly to a data transfer device in which data transfer between blocks having clock domains different from each other is performed in synchronization with a clock signal.

2. Description of Related Art

FIG. 20 is a block diagram showing a conventional data transfer device arranged in a serial communication apparatus. In FIG. 20, a reference sign A indicates a high speed operating block, a reference sign B indicates a low speed operating block, and a reference sign C indicates a clock signal producing block.

Next, an operation of the conventional data transfer device will be described below.

Assuming that protocol processing or signal processing is performed for serial communication data in a high speed serial communication apparatus in synchronization with a clock signal having a frequency equal to or higher than that corresponding to a transmission rate of data, the number of gates serially placed for one cycle of the clock signal in a data transfer device is undesirably increased. Therefore, it is difficult to arrange circuit elements of the data transfer device in the high speed serial communication apparatus.

Therefore, in the data reception performed in the conventional data transfer device shown in FIG. 20, when serial communication data transmitted from the outside is received in the high speed operating block A in synchronization with a clock signal CLK-A having a frequency equal to or higher than that corresponding to a transmission rate of the serial communication data, the serial communication data is converted into parallel data, the parallel data is transferred to in the low speed operating block B, and protocol processing is generally performed for the parallel data in the low speed operating block B in synchronization with a clock signal CLK-B having a frequency lower than that corresponding to the transmission rate of the serial data.

Also, in the data transmission, most of protocol processing is performed in the low speed operating block B for each piece of parallel data, the parallel data is transferred to the high speed operating block A, the parallel data is converted into serial communication data in the high speed operating block A, minimum part of processing is performed for the serial communication data in the high speed operating block A, and the serial communication data is transmitted to the outside.

Because the conventional data transfer device has the above-described configuration, there are following problems.

Because the frequency of the clock signal CLK-A used for the operation of the high speed operating block A differs from the clock signal CLK-B used for the low speed operating block B, data transfer between the operating blocks A and B is asynchronously performed. Therefore, a countermeasure for metastable (or asynchronous data transfer) is required to perform the data transfer between the operating blocks A and B. However, in cases where the countermeasure for metastable is performed in the conventional data transfer device, a problem has arisen that the number of flip-flop circuits (or-registers) in the conventional data transfer device is undesirably increased, electric power consumed in the flip-flop circuits is undesirably increased, gate size is undesirably increased, and internal delay of data is undesirably increased.

Also, in cases where the relation between the clock signal CLK-A of the high speed operating block A and the clock signal CLK-B of the low speed operating block B is expressed according to an equation (Frequency of clock signal CLK-A)=(Frequency of clock signal CLK-B)×(bit length of parallel data), a clock skew between the clock signals CLK-A and CLK-B is adjusted so as to synchronize the clock signal CLK-B with the clock signal CLK-A. In this case, data transfer between the operating blocks A and B can be synchronously performed without performing the countermeasure for metastable. For example, a frequency of the clock signal CLK-A is equal to 480 MHz, a frequency of the clock signal CLK-B is equal to 60 MHz, and a bit length of parallel data is equal to 8 bits. However, it is required to adjust a clock skew between the clock signals CLK-A and CLK-B. Therefore, a problem has arisen that it takes a lot of time to design a data transfer device.

In cases where coding processing such as non-return to zero insert (NRZI) or alternation mark inversion (AMI) coding, coding processing for reception data (RX) and self-synchronization processing are performed for the serial communication data, bit stuffing processing is sometimes performed for the serial communication data for the purpose of the self-synchronization (refer to a literature of "Universal Serial Bus Specification Revision 2.0" pp. 157–158).

In a serial communication apparatus in which self-synchronization is obtained according to the bit stuffing processing, a stuff bit is removed from serial communication data in a data receiving operation, and a stuff bit is inserted into serial communication data in a data transmitting operation. Therefore, in this case, even though the countermeasure for metastable is performed or the clock skew between the clock signals CLK-A and CLK-B is adjusted, data transfer between the operating blocks A and B cannot be synchronously performed.

In the prior art, to synchronously perform data transfer between the operating blocks A and B in the serial communication apparatus in which self-synchronization is obtained according to the bit stuffing processing, following two methods are adopted.

In a first method, the transfer of parallel data RxData and TxData between the operating blocks A and B is controlled in handshaking.

In a second method, the number of stuff bits in the serial transmission data is counted. In a data receiving operation, when the counted value of the stuff bits reaches a bit length of parallel data RxData transferred from the operating block A to the operating block B, a RxValid signal for the parallel data is negated. In this case, the parallel data RxData is treated as invalid data (refer to a literature "USB2.0 Transceiver Macrocell Interface (UTMI) Specification" Ver1.05 page 23 5.6 Bit Unstuff Logic & FIG. 5). In a data transmitting operation, when the counted value of the stuff bits reaches a bit length of parallel data TxData transferred from the operating block B to the operating block A, a TxReady signal is negated to stop the transmission of parallel data TxData from a protocol processing unit of the low speed operating block A (refer to a literature "USB2.0 Transceiver Macrocell Interface (UTMI) Specification" Ver1.05 page 29 5.11 Bit Unstuff Logic & FIG. 11).

However, in these conventional methods, a counter for counting the number of stuff bits or the number of pieces of effective data is required, and logic circuits for producing control signals of data are required. In a circuit operated at a high operating frequency, it is difficult to increase the number of logic circuits placed between flip-flop circuits (or registers). Therefore, a problem has arisen that it is difficult to arrange these logic circuits in a data transfer device. Also, even though these logic circuits can be placed in a data transfer device, a problem has arisen that consumed electric power and gate size in the logic circuits are undesirably increased.

SUMMARY OF THE INVENTION

A main object of the present invention is to provide, with due consideration to the drawbacks of the conventional data transfer device, a data transfer device in which data transfer between operating blocks having clock domains different from each other is synchronously performed without the adjustment of clock skew between clock signals of the operating blocks or a countermeasure for asynchronous data transfer between the operating blocks.

Also, a subordinate object of the present invention is to provide a data transfer device in which data transfer between operating blocks having clock domains different from each other is synchronously performed in serial communication performed according to bit stuffing processing while preventing the increase of the total number of gates and the increase of the number of gates serially placed due to a countermeasure for overflow or underflow and preventing the increase of consumed electric power due to the increase of the total number of gates.

The main object is achieved by the provision of a data transfer device including a high speed operating unit operation in synchronization with a first clock signal and a low speed operating unit operation in synchronization with a second clock signal, and the high speed operating unit includes a count signal producing unit, a clock signal producing unit and a data converting unit. In the count signal producing unit, the number of pulses of the first clock is circularly counted, and count signals indicating count values are produced. In the clock signal producing unit, the second clock signal is produced according to two count signals in synchronization with the first clock signal. In the data converting unit, input serial data is converted into reception parallel data, the reception parallel data is driven in response to one count signal so as to be sampled in the low speed operating unit in synchronization with the second clock signal. Also, transmission parallel data driven in the low speed operating unit in synchronization with the second clock signal is sampled in response to one count signal, the transmission parallel data is converted into output serial data, and the output serial data is transmitted.

Therefore, a setup time from the driving operation to the sampling operation for data and a hold time from the sampling operation to the driving operation for data can be sufficiently set in the data transfer between the high speed operating unit and the low speed operating unit, and the data transfer can be reliably performed in synchronization with the second clock signal. Accordingly, the data transfer between the operating units having clock domains different from each other can be synchronously performed without the adjustment of clock skew between the first clock signals and the second clock signal or a countermeasure for asynchronous data transfer between the operating blocks.

The subordinate object is achieved by the provision of a data transfer device further including a stuff bit control signal producing unit. In the stuff bit control signal producing unit, a stuff bit control signal indicating the detection or the insertion of a stuff bit in synchronization with the first clock signal. In the count signal producing unit, the counting is stopped according to the stuff bit control signal so as to hold the count value during a time period corresponding to the stuff bit. In the data converting unit, a stuff bit is removed from the input serial data, and bit-data placed just before the stuff bit is held during a time period corresponding to the stuff bit according to the stuff bit control signal. Also, a stuff bit is inserted in the output serial data according to the stuff bit control signal.

Therefore, the cycle of the second clock is lengthened by the time period corresponding to the stuff bit when a stuff bit is detected or inserted, and the synchronous data transfer between the high speed operating unit and the low speed operating unit can be maintained. Accordingly, even though serial communication is performed according to bit stuffing processing, the data transfer between operating blocks having clock domains different from each other can be synchronously performed while preventing the increase of the total number of gates and the increase of the number of gates serially placed due to a countermeasure for overflow of the input serial data or a countermeasure for underflow of the output serial data and preventing the increase of consumed electric power due to the increase of the total number of gates.

BRIEF DESCRIPTION OF THE DRAWINGS

FIG. 2 is an explanatory view of various signals used in the data transfer device shown in FIG. 1;

FIG. 7 is a block diagram of a data transfer device according to a second embodiment of the present invention;

FIG. 9 is a timing chart of various signals used in the data transfer device shown in FIG. 7 in a serial data transmitting operation;

DETAILED DESCRIPTION OF THE PREFERRED EMBODIMENTS

Embodiments of the present invention will now be described with reference to the accompanying drawings.

Embodiment 1

Figure 1:
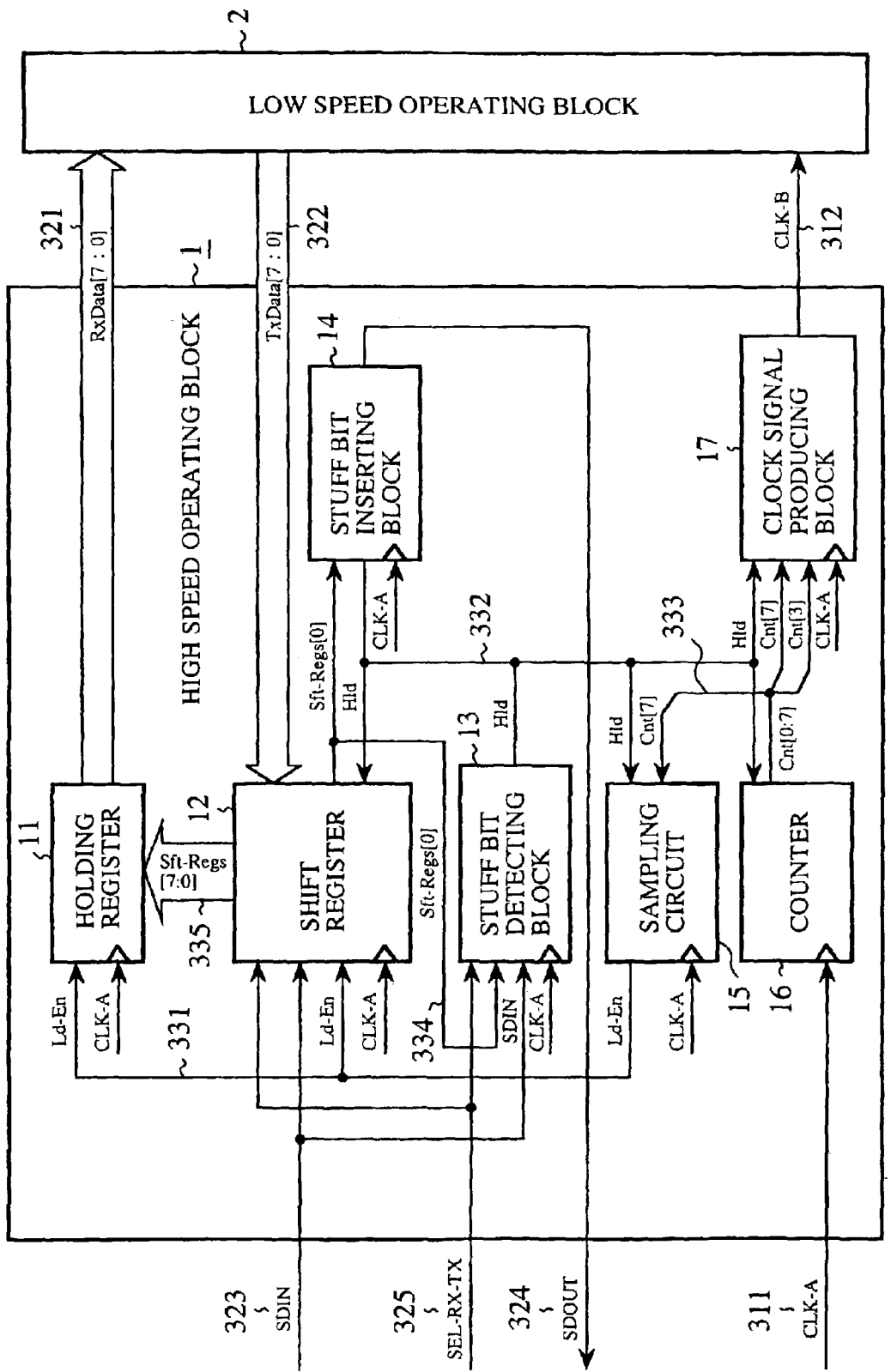
FIG. 1 is a block diagram showing a data transfer device according to a first embodiment of the present invention.

FIG. 1 is a block diagram showing a data transfer device according to a first embodiment of the present invention. In this embodiment, serial transmission of data is performed according to serial bus standards of USB (Universal Serial Bus).

In detail, in cases where six pieces of bit-data successively set to the high level ("111111") in input serial data are received in a data transfer device, a piece of bit-data of the low level ("0") additionally placed just after the six pieces of successive bit-data of the input serial data as a stuff bit is received in the data transfer device. That is, in the serial transmission, input serial data has a stuff bit just after each group of six pieces of bit-data successively set to the high level ("1111110"). Also, In cases where six pieces of bit-data successively set to the high level ("111111") in output serial data are transmitted from a data transfer device, a piece of bit-data set to the low level is additionally added just after the six pieces of successive bit-data of the output serial data as a stuff bit in the data transfer device, and the output serial data including the stuff bit ("1111110") is transmitted from the data transfer device.

In FIG. 1, a clock signal CLK-B is transmitted from a high speed operating block 1 to a low speed operating block 2 through a signal line 312, reception parallel data RxData is transmitted from the high speed operating block 1 to the low speed operating block 2 through a bus 321, and transmission parallel data TxData is transmitted from the high speed operating block 1 to the low speed operating block 2 through a bus 322. Here, control signals such as a RxValid signal, a RxActive signal and a TxReady signal transmitted between the high speed operating block 1 and the low speed operating block 2 are omitted, and drive timing of these control signals is the same as that of the reception parallel data RxData and the transmission parallel data TxData.

Figure 3:
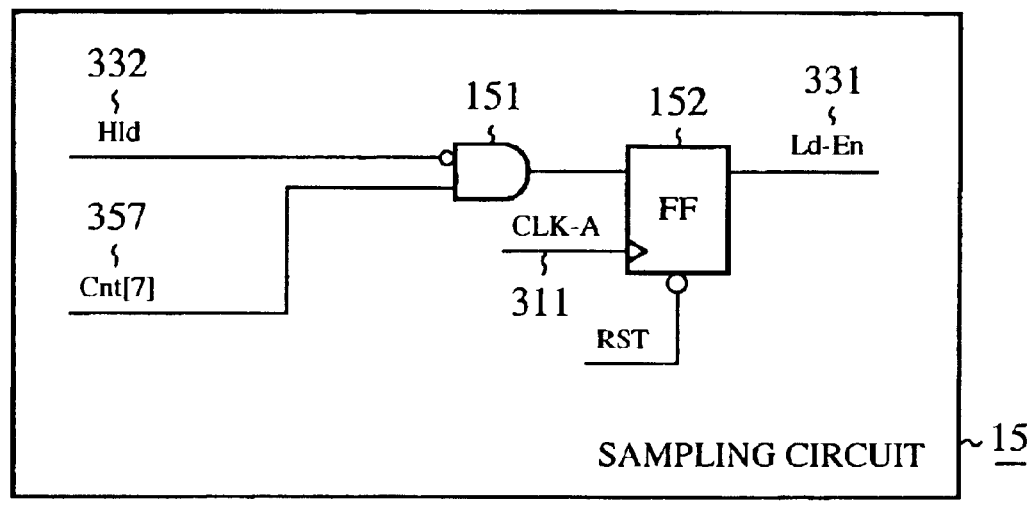
FIG. 3 is a circuit view of a sampling circuit shown in FIG. 1.
Figure 4:
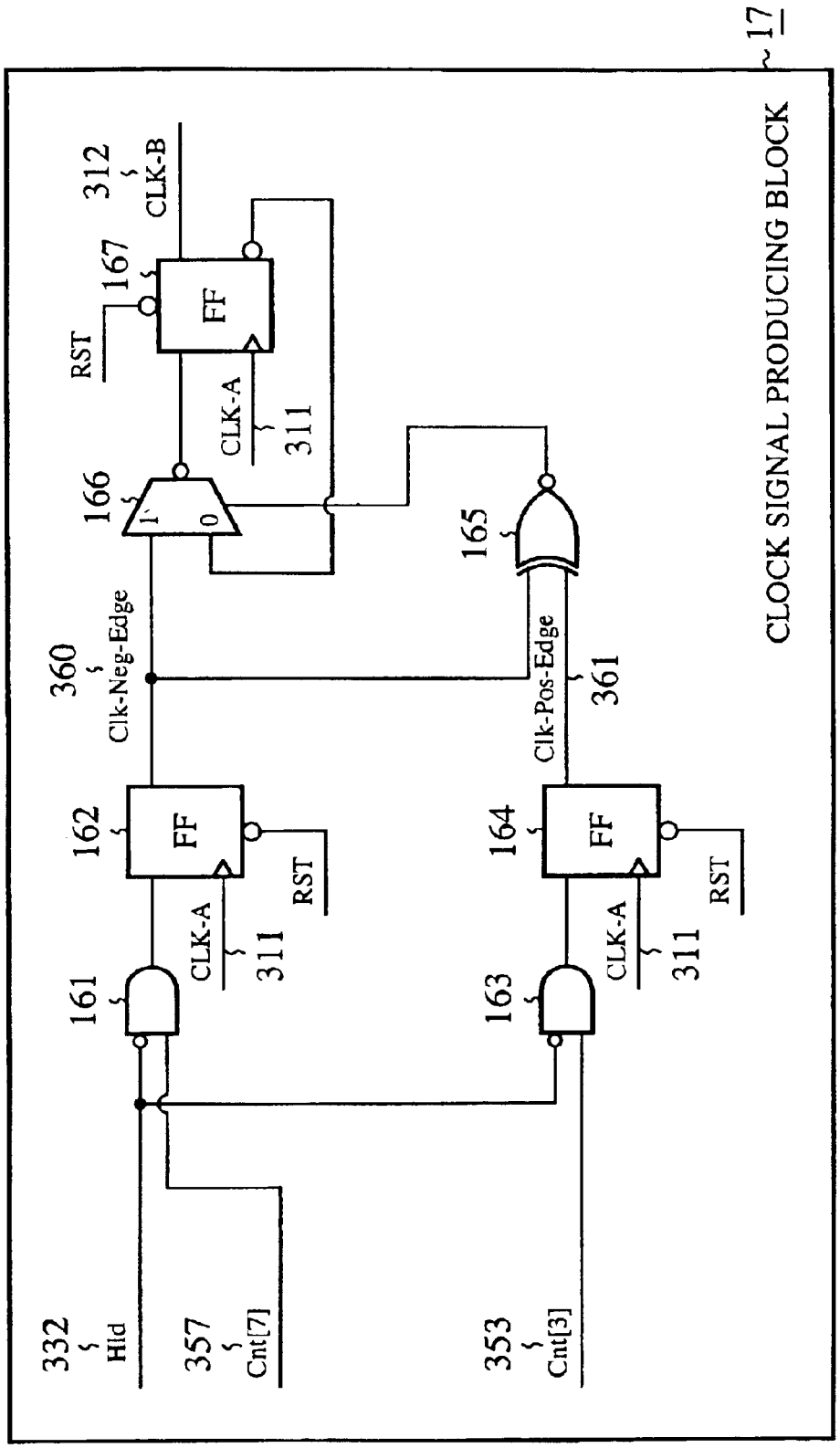
FIG. 4 is a circuit view of a clock signal producing block shown in FIG. 1.
Figure 5:
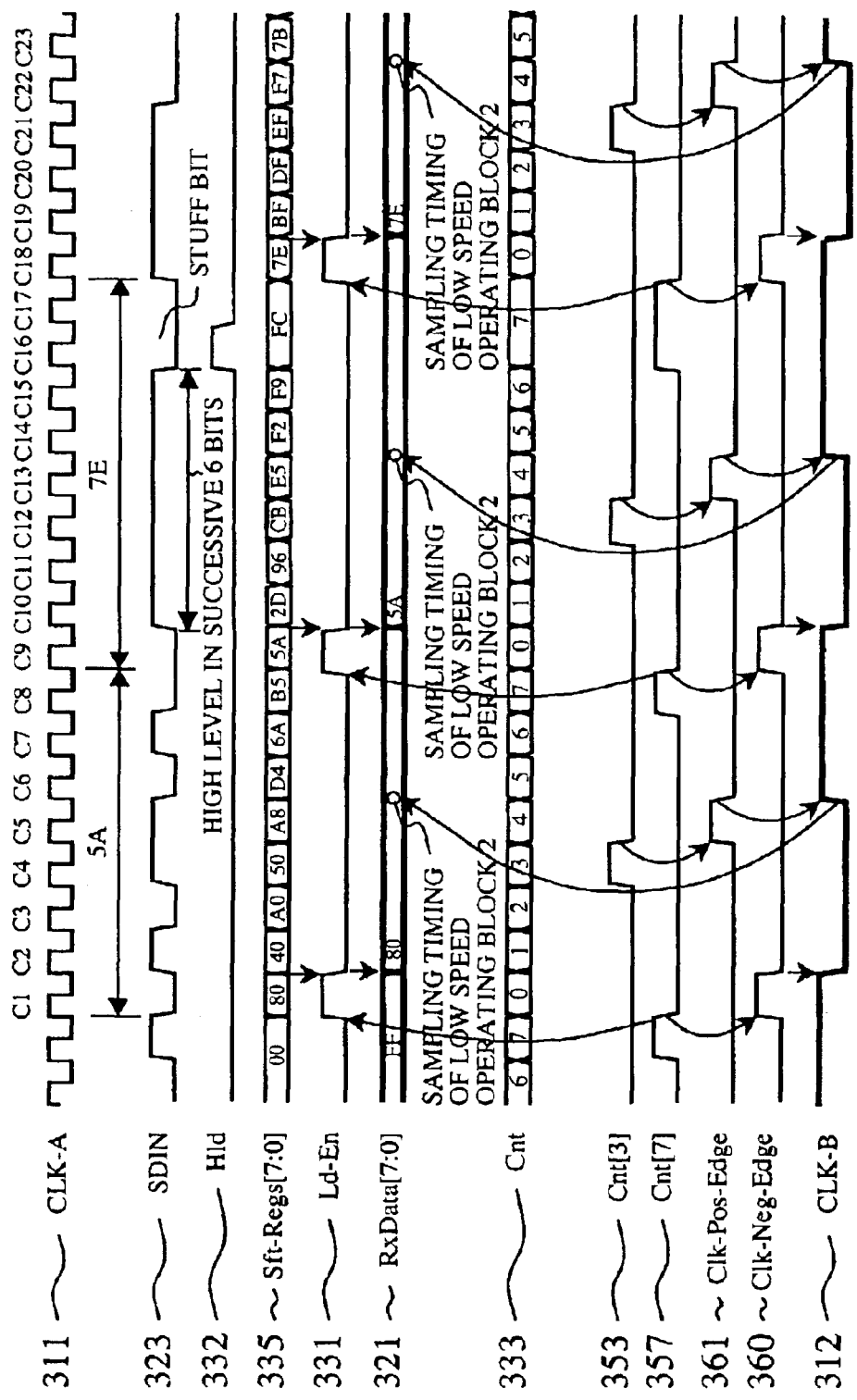
FIG. 5 is a timing chart of various signals used in the data transfer device shown in FIG. 1 in a serial data receiving operation.
Figure 6:
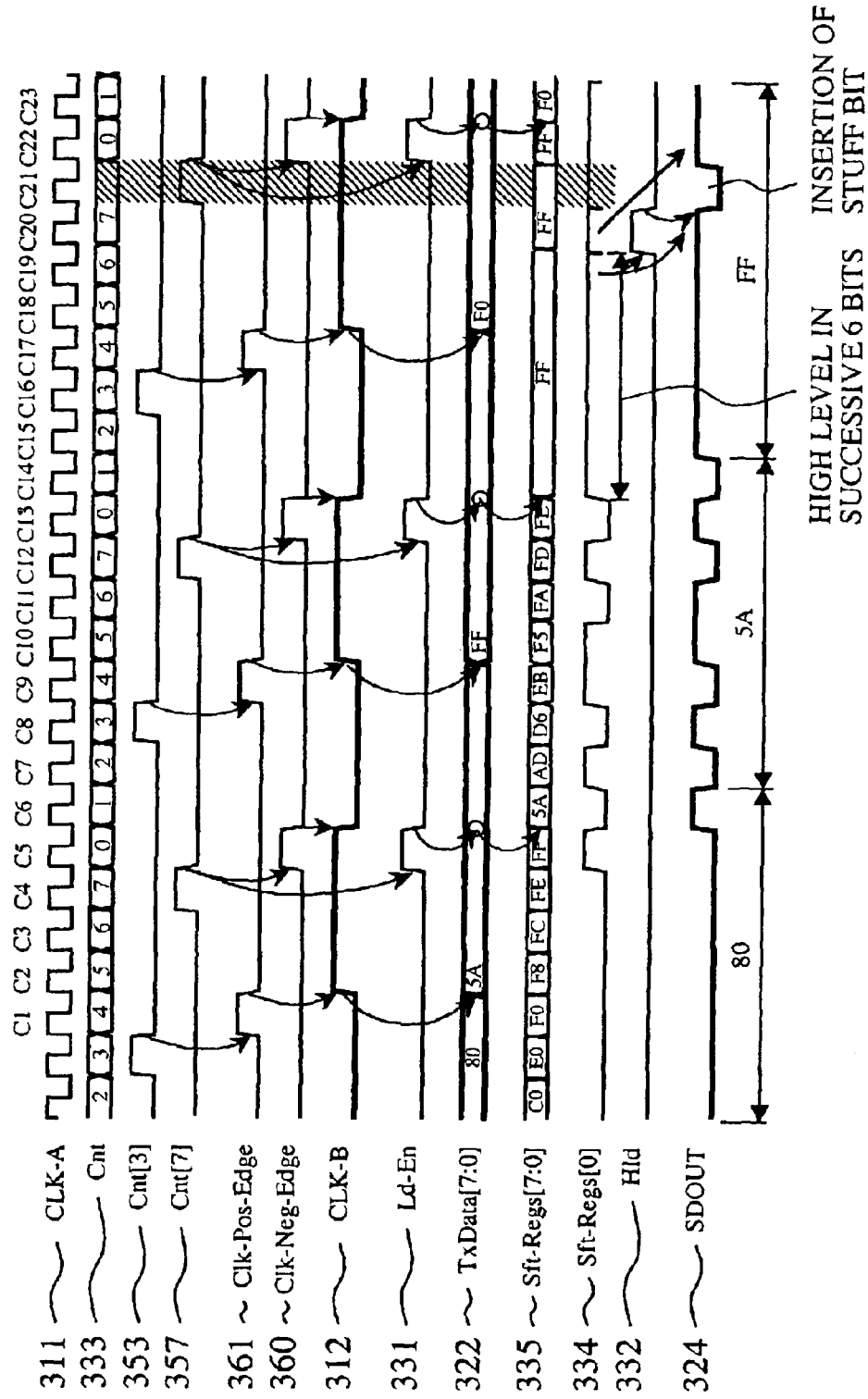
FIG. 6 is a timing chart of various signals used in the data transfer device shown in FIG. 1 in a serial data transmitting operation.

FIG. 2 is an explanatory view of various signals used in the data transfer device. FIG. 3 is a circuit view of a sampling circuit shown in FIG. 1. FIG. 4 is a circuit view of a clock signal producing block shown in FIG. 1. FIG. 5 is a timing chart of various signals used in the data transfer device in a serial data receiving operation. In this timing chart, pieces of 8-bit reception parallel data FF, 80, 5A and 7E are driven and sampled in that order. FIG. 6 is a timing chart of various signals used in the data transfer device in a serial data transmitting operation. In this timing chart, pieces of 8-bit transmission parallel data 80, 5A, FF and F0 are driven and sampled in that order.

In FIG. 1, 1 indicates the high speed operating block (or high speed operating unit) for receiving pieces of bit-data of input serial data SDIN from the outside in synchronization with pulses of a clock signal CLK-A (or a first clock signal) and transmitting pieces of bit-data of output serial data SDOUT to the outside in synchronization with pulses of the clock signal CLK-A. In this embodiment, the clock signal CLK-A has a frequency corresponding to a transmission rate of both the input serial data SDIN and the output serial data SDOUT. However, it is applicable that the clock signal CLK-A have a frequency corresponding to a transmission rate higher than that of both the input serial data SDIN and the output serial data SDOUT.

2 indicates the low speed operating block (or low speed operating unit) for performing protocol processing for both the reception parallel data RxData transferred from the high speed operating block 1 and the transmission parallel data TxData in synchronization with the clock signal CLK-B (or a second clock signal) having a frequency lower than that of the clock signal CLK-A, and transferring the transmission parallel data TxData to the high speed operating block 1.

12 indicates a shift register (or data converting unit) for receiving the input serial data SDIN through a bus 323 in a serial data receiving operation, converting the input serial data SDIN into 8-bit parallel data Sft-Regs[7:0], receiving the 8-bit transmission parallel data TxData[7:0] transferred from the low speed operating block 2 in a serial data transmitting operation, and converting the transmission parallel data TxData into serial data Sft-Regs[0]. In the shift register 12, a right shift is performed for the input serial data SDIN in the serial data receiving operation regardless of the value of a load enable signal Ld-En sent through a signal line 331. In the serial data transmitting operation, the transmission parallel data TxData transferred from the low speed operating block 2 is sampled when the load enable signal Ld-En is set to the high level, and a right shift is performed for the transmission parallel data TxData when the load enable signal Ld-En is set to the low level. Therefore, the transmission parallel data TxData is converted into the serial data Sft-Regs[0]. Also, in both the serial data transmitting operation and the serial data receiving operation, when a holding signal Hld set to the high level is received in the shift register 12, no shift operation is performed in the shift register 12, and a piece of bit-data of the transmission parallel data TxData and a piece of bit-data of the parallel data Sft-Regs[7:0] are held in the shift register 12 during one cycle of the clock signal CLK-A. In this embodiment, the shift register 12 is used for both the serial data transmitting operation and the serial data receiving operation. However, it is applicable that one shift register used for the serial data transmitting operation and another shift register used for the serial data receiving operation be prepared.

11 indicates a holding register (or data holding unit) for holding the parallel data Sft-Regs[7:0] until the driving operation of the parallel data Sft-Regs[7:0] and setting up the parallel data Sft-Regs[7:0] until the sampling operation. In the serial data receiving operation, when the load enable signal Ld-En is set to the high level, the parallel data Sft-Regs[7:0] sent from the shift register 12 through a bus 335 and held in the holding register 11 is driven (at the pulses C2, C10 and C19 of the clock signal CLK-A in FIG. 5), and the parallel data Sft-Regs[7:0] is set up in the holding register 11 until the parallel data Sft-Regs[7:0] is sampled in the lows peed operating block 2 as the reception parallel data RxData.

13 indicates a stuff bit detecting block (or a stuff bit control signal producing unit) for detecting a stuff bit inserted into the input serial data SDIN in the serial data receiving operation, and detecting six pieces of bit-data successively set to the high level from the serial data Sft-Regs[0] in the serial data transmitting operation. When a stuff bit is detected in the serial data receiving operation, a holding signal Hld (or a stuff bit control signal) set to the high level is output from the stuff bit detecting block 13. Also, when six pieces of bit-data successively set to the high level in the serial data Sft-Regs[0] is detected, a holding signal Hld (or a stuff bit control signal) set to the high level is output from the stuff bit detecting block 13. In the protocol of USB, for example, when six pieces of bit-data of serial data are successively set to "1", a piece of bit-data set to "0" is necessarily added just after the six pieces of bit-data of the serial data as a stuff bit. Therefore, because the stuff bit detecting block 13 is used according to the protocol of USB, only when six pieces of bit-data of the input serial data SDIN or six pieces of bit-data of the serial data Sft-Regs[0] are successively set to "1", the holding signal Hld is set to the high level. In other cases, the holding signal Hld is set to the low level.

16 indicates a counter (or a count signal producing unit) for counting the number of pulses of the clock signal CLK-A in case of the low level of the holding signal Hld to circularly obtain a count value in a count range from "0" to "7" corresponding to a clock cycle of the clock signal CLK-B, outputting a count signal Cnt[3] set to the high level in case of the count value of "3" and outputting a count signal Cnt[7] set to the high level in case of the count value of "7". A range of the count value in the counter 16 depends on a width of the data bus 321, 322 between the high speed operating block 1 and the low speed operating block 2. In the first embodiment, the data bus width is set to 8 bits. Therefore, a count value starting from "0" is incremented until the count value reaches "7", After the count value of "7", the count value is set to "0", and the count value is again incremented. Also, when the holding signal Hld is set to the high level, the count value is not incremented, and the count value recently obtained is held during one cycle of the clock CLK-A (corresponding to the pulse C1 of the clock CLK-A in FIG. 5 and the pulse C21 of the clock CLK-A in FIG. 6).

Figure 17:
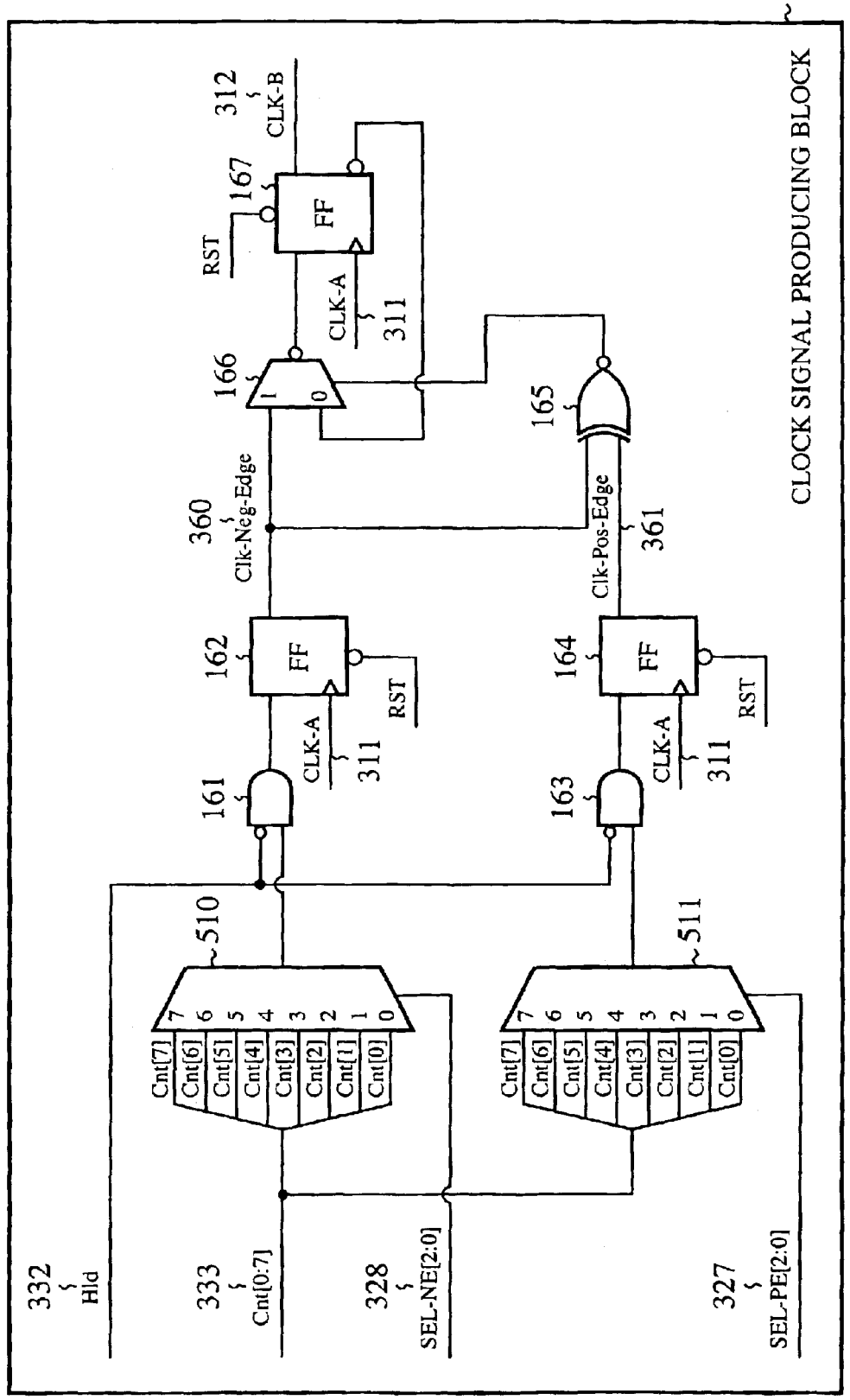
FIG. 17 is a circuit view of a clock signal producing block shown in FIG. 16.

17 indicates a clock signal producing block (or a clock signal producing unit) for producing the clock signal CLK-B by forming a leading edge (or first edge) of each pulse according to the count signal Cnt[3] in synchronization with the clock signal CLK-A and forming a trailing edge (or a second edge) of each pulse according to the count signal Cnt[7] in synchronization with the clock signal CLK-A. The configuration of the clock signal producing block 17 is shown in FIG. 17 in detail. In FIG. 4, 161 and 163 indicate AND gates respectively. 162, 164 and 167 indicate flip-flops respectively. 165 indicates an exclusive NOR gate. 166 indicates a selector.

An operation of the clock signal producing block 17 will be described below. When the count signal Cnt[7] set to the high level and the holding signal Hld set to the low level are received in the AND gate 161, an output signal of the AND gate 161 is set to the high level, and a CLK-B trailing edge enable signal Clk-Neg-Edge set to the high level is output from the flip-flop 162 in synchronization with a leading edge of the clock signal CLK-A (pulses C1, C9 and C18 of the clock signal CLK-A in FIG. 5, and pulses C5, C13 and C22 of the clock signal CLK-A in FIG. 6). Also, when the count signal Cnt[3] set to the high level and the holding signal Hld set to the low level are received in the AND gate 163, an output signal of the AND gate 163 is set to the high level, and a CLK-B leading edge enable signal Clk-Pos-Edge set to the high level is output from the flip-flop 164 in synchronization with a leading edge of the clock signal CLK-A (pulses C5, C13 and C22 of the clock signal CLK-A in FIG. 5, and pulses C1, C9 and C17 of the clock signal CLK-A in FIG. 6). Also, when the CLK-B leading edge enable signal Clk-Pos-Edge is set to the high level, the clock signal CLK-B is set to the high level in synchronization with a leading edge of the clock signal CLK-A by the functions of the exclusive NOR gate 165, the selector 166 and the flip-flop 167 (pulses C6, C14 and C23 of the clock signal CLK-A in FIG. 5, and pulses C2, C10 and C18 of the clock signal CLK-A in FIG. 6). When the CLK-B trailing edge enable signal Clk-Neg-Edge is set to the high level, the clock signal CLK-B is set to the low level in synchronization with a leading edge of the clock signal CLK-A by the functions of the exclusive NOR gate 165, the selector 166 and the flip-flop 167 (pulses C2, C10 and C19 of the clock signal CLK-A in FIG. 5, and pulses C6, C14 and C23 of the clock signal CLK-A in FIG. 6). When the holding signal Hld is set to the low level, the timing of the count signal Cnt[3] set to the high level and the timing of the count signal Cnt[7] set to the high level differ from each other by half of the count range of the counter 16, and the leading and trailing edges of the clock signal CLK-B are alternately formed at equal intervals.

15 indicates a sampling circuit (or a load enable signal producing unit) for producing a load enable signal Ld-En which is set to the high level in response to the count signal Cnt[7] set to the high level in both the serial data transmitting operation and the serial data receiving operation. One bit-data of the parallel data Sft-Regs[7:0] output from the shift register 12 is held in the holding register 11 in response to the load enable signal Ld-En set to the high level, and the transmission parallel data TxData transferred from the low speed operational block 2 is sampled in the shift register 12 in response to the load enable signal Ld-En set to the high level.

The configuration of the sampling circuit 15 is shown in FIG. 3 in detail. In FIG. 3, 151 indicates an AND gate. 152 indicates a flip-flop. An operation of the sampling circuit 15 will be described below. Only when the count signal Cnt[7] set to the high level and the holding signal Hld set to the low level are input to the AND gate 151, the load enable signal Ld-En set to the high level is output from the flip flop 152 (pulses C1, C9 and C18 of the clock signal CLK-A in FIG. 5, and pulses C5, C13 and C22 of the clock signal CLK-A in FIG. 6).

14 indicates a stuff bit inserting block (or data converting unit) for inserting a stuff bit into the serial data sft-regs[0] in the serial data transmitting operation and outputting the serial data sft-regs[0] as the output serial data SDOUT. When the holding signal Hld set to the high level is received in the stuff bit inserting block 14, the serial data Sft-Regs[0] is compulsorily set to the low level, and the serial data Sft-Regs[0] is output as the output serial data SDOUT (a pulse C21 in FIG. 6).

Next, an operation of the data transfer device will be described below.

The count signals Cnt[0] to Cnt[7] are produced in synchronization with the clock signal CLK-A in the counter 16, and the clock signal CLK-B is formed in the clock signal producing block 17 by forming the leading edge of each pulse in response to the count signal Cnt[3] and forming the trailing edge of each pulse in response to the count signal Cnt[7]. Therefore, a cycle of the clock signal CLK-B is set to a time period of eight pulses of the clock signal CLK-A. Thereafter, the clock signal CLK-B is transmitted to the low poer operating block 2. Also, the load enable signal Ld-EN is set to the high level in the sampling circuit 15 in response to the count signal Cnt[7].

In the serial data receiving operation, when no holding signal Hld set to the high level is received in the shift register 12, the serial-parallel conversion is performed for the input serial data SDIN in the shift register 12 to produce the parallel data Sft-Regs [7:0] from the input serial data SDIN while performing the right shift for the input serial data SDIN in synchronization with the clock signal CLK-A, and the parallel data Sft-Regs [7:0] is held in the holding register 11.

Also, in the serial data transmitting operation, the parallel-serial conversion is performed in the shift register 12 for the transmission parallel data TxData transferred from the low power operating block 2 to produce the serial data Sft-Regs [0] from the transmission parallel data TxData, and the serial data Sft-Regs[0] is output as output serial data SDOUT to the bus line 324 through the stuff bit inserting block 14.

(1) When a stuff bit inserted into the input serial data SDIN is detected or a stuff bit is inserted into the serial data sft-regs[0] denoting the output serial data SDOUT, the cycle of the clock signal CLK-B at the timing of the detection or insertion of the stuff bit is lengthen by a time period (or one cycle of the clock signal CLK-A) of the detected or inserted stuff bit.

In detail, in the serial data receiving operation shown in FIG. 5, because six pieces of bit-data of the input serial data SDIN are successively set to the high level during the time period from the pulse C10 to the pulse C15 of the clock signal CLK-A, a stuff bit inserted into the input serial data SDIN is received in the high speed operating block 1 in the time period of the pulse C16 of the clock signal CLK-A. Therefore, when the stuff bit inserted into the input serial data SDIN is detected in the stuff bit detecting block 13, the holding signal Hld set to the high level is output from the stuff bit detecting block 13 to the shift register 12, the stuff bit inserting block 14, the sampling circuit 15, the counter 16 and the clock signal producing block 17 in the time period of the pulse C16 of the clock signal CLK-A, and the shift register 12, the sampling circuit 15, the counter 16 and the clock signal producing block 17 are set to the hold state respectively in the time period of the pulse C17 of the clock signal CLK-A.

Therefore, the counting operation of the counter 16 is stopped in the time period of the pulse C17, one count signal (in this embodiment, the count signal [7]) recently obtained in the time period of the pulse C16 is held in the time period of the pulse C17, and the counting operation of the counter 16 is again started from the time period of the pulse C18 of the clock signal CLK-A. In this case, a pulse repetition time period between pulses of the clock signal CLK-B corresponding to the timing of the detection of the stuff bit is lengthened by the time period corresponding to the stuff bit equal to the time period of one pulse of the clock signal CLK-A and is set to a time period of five pulses of the clock signal CLK-A (from the pulse C14 to the pulse C19 of the clock signal CLK-A). Therefore, the cycle of the clock signal CLK-B is lengthened to nine pulses of the clock signal CLK-A (from the pulse C14 to the pulse C23 of the clock signal CLK-A).

Also, the shift operation of the shift register 12 is stopped in the time period of the pulse C17 of the clock signal CLK-A. Therefore, the stuff bit placed just after the six pieces of bit-data of the input serial data SDIN is removed from the parallel data Sft-Regs [7:0], and one piece of bit-data (in this embodiment, bit-data FC) placed just before the stuff bit and recently set in the shift register 12 as one piece of bit-data of the parallel data Sft-Regs [7:0] is held in the holding register 11 as one piece of bit-data of the parallel data Sft-Regs [7:0] in the time period of the pulse C17. That is, the piece of bit-data is twice held in the holding register 11.

Therefore, in cases where the parallel data Sft-Regs [7:0] having the bit-data FC in duplication is sampled in the low power operating block 2 as the reception parallel data RxData[7:0] in synchronization with the clock signal CLK-B, because the cycle of the clock signal CLK-B is lengthened by the time period corresponding to the stuff bit equal to the time period of one pulse of the clock signal CLK-A, no bit shift occurs in the reception parallel data RxData for the clock signal CLK-B. For example, the 9 bit parallel data composed of 2D, 96, CB, E5, F2, F9, FC, FC and 7F is sampled in the low power operating block 2 as the 8-bit reception parallel data RxData[7:0] composed of 2D, 96, CB, E5, F2, F9, FC and 7F in synchronization with the clock signal CLK-B having the pulse repetition time period of nine pulses of the clock signal CLK-A.

Accordingly, even though the stuff bit is inserted into the input serial data SDIN, the reception parallel data RxData [7:0] can be processed in the low speed operating block 2 in synchronization with the clock signal CLK-B.

In the serial data transmitting operation shown in FIG. 6, six pieces of bit-data or more in the serial data Sft-Regs[0] produced from the transmission parallel data TxData in the shift register 12 are successively set to the high level in a time period starting from the pulse C14 of the clock signal CLK-A. In this case, when six pieces of bit-data of the serial data Sft-Regs[0] are successively set to the high level during the time period of the pulses C14 to C19 of the clock signal CLK-A, the holding signal Hld set to the high level is output from the stuff bit detecting block 13 to the shift register 12, the stuff bit inserting block 14, the sampling circuit 15, the counter 16 and the clock signal producing block 17 in the time period of the pulse C20 of the clock signal CLK-A to set the shift register 12, the sampling circuit 15, the counter 16 and the clock signal producing block 17 to the hold state respectively.

Thereafter, in the stuff bit inserting block 14, because the shift register 12 is set in the hold state in the time period of the pulse C20 of the clock signal CLK-A, a stuff bit of the low level is inserted at a position just after the six pieces of bit-data of the serial data Sft-Regs[0], and one piece of bit-data following the six pieces of bit-data in the trabsnission parallel data TxData is placed just after the stuff bit. As a result, the serial data Sft-Regs[0] having the stuff bit after the six pieces of bit-data of the high level is output as the output serial data SDOUT. The output serial data SDOUT has the stuff bit in the time period of the pulse C21 of the clock signal CLK-A.

Also, though the cycle of the clock signal CLK-B is normally set to a time period of eight pulses of the clock signal CLK-A, a pulse repetition time period between pulses corresponding to the timing of the insertion of the stuff bit is lengthened by the time period corresponding to the stuff bit equal to the time period of one pulse of the clock signal CLK-A, and the cycle of the clock signal CLK-B is set to a time period of nine pulses of the clock signal CLK-A in the time period from the pulse C14 to the pulse C23 of the clock signal CLK-A.

Accordingly, when nine pieces of bit-data including the stuff bit are transmitted to the bus 324 as the output serial data SDOUT, because the transmission parallel data TxData is driven in response to the leading edge of the clock signal CLK-B having the cycle lengthened to the time period of nine pulses of the clock signal CLK-A, no underflow of the output serial data SDOUT occurs due to the insertion of the stuff bit.

[2] When the reception parallel data RxData is transferred from the high speed operating block 1 to the low speed operating block 2, the reception parallel data RxData is driven in the high speed operating block 1 substantially in synchronization with each trailing edge (or second edge) of the clock signal CLK-B, and the reception parallel data RxData is sampled in the low speed operating block 2 in synchronization with each leading edge of the clock signal CLK-B. As an example, this operation is described with reference to the timing chart of the serial data receiving operation shown in FIG. 5.

As shown in FIG. 5, the count signal Cnt[7] is set to the high level (at the pulses C8 and C17 of the clock pulse CLK-A) in the counter 16, the load enable signal Ld-En is set to the high level (at the pulses C1, C9 and C18 of the clock pulse CLK-A) in the sampling circuit 15 in response to the count signal Cnt[7] set to the high level, the parallel data Sft-Regs[7:0] obtained from the input serial data SDIN in the shift register 12 is held in the holding register 11 in response to the load enable signal Ld-En set to the high level, and the reception parallel data RxData is driven in the holding register 11 in synchronization with the leading edges of the pulses C2, C10 and C19 of the clock pulse CLK-A in response to the load enable signal Ld-En set to the high level so as to set up the reception parallel data RxData. Also, in the clock producing block 17, the CLK-B trailing edge enable signal Clk-Neg-Edge is set to the high level (at the pulses C1, C9 and C18 of the clock pulse CLK-A) in response to the count signal Cnt[7] set to the high level, and the trailing edges of the clock signal CLK-B are formed at the pulses C2, C10 and C18 of the clock signal CLK-A in response to the trailing edge enable signal Clk-Neg-Edge set to the high level. Therefore, the reception parallel data RxData is driven in the high speed operating block 1 substantially in synchronization with the trailing edges of the clock signal CLK-B synchronized with the leading edges of the pulses C2, C10 and C18 of the clock signal CLK-A. Thereafter, the reception parallel data RxData driven and set up in the holding register 11 is sampled in the low speed operating block 2 in synchronization with the leading edges of the clock signal CLK-B synchronized with the leading edges of the pulses C6, C14 and C23 of the clock signal CLK-A.

In this case, the reception parallel data RxData is set up in the holding register 11 during a setup time equal to a time period 4CLK-A of four pulses of the clock signal CLK-A until the sampling operation after the reception parallel data RxData is driven substantially in synchronization with each trailing edge of the clock signal CLK-B, and the reception parallel data RxData is held in the holding register 11 during a hold time equal to the time period 4CLK-A of four pulses of the clock signal CLK-A until the driving operation after the reception parallel data RxData is sampled in synchronization with each leading edge of the clock signal CLK-B. Therefore, because the hold time from the sampling operation to the driving operation and the setup time from the driving operation to the sampling operation are sufficiently set for the reception parallel data RxData, unless the delay of the sampling of the reception parallel data RxData exceeding the time period 4CLK-A occurs, it is not required to perform a countermeasure for the asynchronous data transfer. Also, because the reception parallel data RxData is transferred from the high speed operating block 1 to the low speed operating block 2 in synchronization with the clock signal CLK-B, it is not required to adjust the clock skew between the clock signals CLK-A and CLK-B.

Accordingly, even though the adjustment of a clock skew between the clock signals CLK-A and CLK-B or a countermeasure for the asynchronous data transfer is not performed, the data transfer device can be designed so as to perform the synchronous data transfer of the reception parallel data RxData from the high speed operating block 1 to the low speed operating block 2.

[3] When the transmission parallel data TxData is transferred from the low speed operating block 2 to the high speed operating block 1, the transmission parallel data TxData is driven in the low speed operating block 2 in synchronization with each leading edge of the clock signal CLK-B, and the transmission parallel data TxData is sampled in the high speed operating block 1 substantially in synchronization with each trailing edge of the clock signal CLK-B. As an example, this operation is described with reference to the timing chart of the serial data transmitting operation shown in FIG. 6.

As shown in FIG. 6, the transmission parallel data TxData is driven in the low speed operating block 2 in response to the leading edges of the clock signal CLK-B synchronized with the leading edges of the pulses C2, C10 and C18 of the clock signal CLK-A.

Also, the count signal Cnt[7] is set to the high level in the counter 16 in the time periods of pulses C4, C12 and C21 of the clock pulse CLK-A, the load enable signal Ld-En is set to the high level in the sampling circuit 15 in response to the count signal Cnt[7] set to the high level in the time periods of pulses C5, C13 and C22 of the clock pulse CLK-A, and the transmission parallel data TxData is sampled in the high speed operating block 1 in response to the load enable signal Ld-En set to the high level. Therefore, the transmission parallel data TxData is sampled substantially in synchronization with the trailing edges of the clock signal CLK-B synchronized with the leading edges of the pulses C6, C14 and C23 of the clock signal CLK-A.

In this case, the transmission parallel data TxData is held in the low speed operating block 2 during a hold time equal to the time period 4CLK-A of four pulses of the clock signal CLK-A until the driving operation after the transmission parallel data TxData is sampled in the holding register 11 substantially in synchronization with each trailing edge of the clock signal CLK-B, and the transmission parallel data TxData is set up in the low speed operating block 2 during a setup time equal to the time period 4CLK-A of four pulses of the clock signal CLK-A until the sampling operation after the transmission parallel data TxData is driven in the low speed operating block 2 in synchronization with each leading edge of the clock signal CLK-B. Therefore, because the hold time from the sampling operation to the driving operation and the setup time from the driving operation to the sampling operation can be sufficiently set for the transmission parallel data TxData, the transmission parallel data TxData can be reliably transferred from the low speed operating block 2 to the high speed operating block 1. In this case, unless the delay of the driving of the transmission parallel data TxData exceeding the time period 4CLK-A occurs, it is not required to perform a countermeasure for the asynchronous transfer. Also, because the transmission parallel data TxData is transferred from the low speed operating block 2 to the high speed operating block 1 in synchronization with the clock signal CLK-B, it is not required to adjust the clock skew between the clock signals CLK-A and CLK-B.

Accordingly, even though the adjustment of a clock skew between the clock signals CLK-A and CLK-B or a countermeasure for the asynchronous data transfer is not performed, the data transfer device can be designed so as to perform the synchronous data transfer of the transmission parallel data TxData from the low speed operating block 2 to the high speed operating block 1.

As is described above, in the first embodiment, following effects can be obtained.

(1) The time period 4CLK-A of four pulses of the clock signal CLK-A can be obtained for the data sampling timing in the data transfer between the high speed operating block 1 and the low speed operating block 2. Accordingly, to perform the synchronous data transfer of both the reception parallel data RxData and the transmission parallel data TxData between the operating blocks 1 and 2, it is not required to perform the countermeasure for the asynchronous transfer or to adjust a clock skew between the clock signals CLK-A and CLK-B.

(2) When a stuff bit of the input serial data SDIN is detected and removed or a stuff bit is inserted into the output serial data SDOUT, the cycle of the clock signal CLK-B at the timing of the removal or insertion of the stuff bit is lengthened by the time period corresponding to the stuff bit equal to one cycle of the clock signal CLK-A. Therefore, both the reception parallel data RxData and the transmission parallel data TxData can be transferred between the operating blocks 1 and 2 in synchronization with the clock signal CLK-B. Accordingly, the increase of the number of gates and the increase of the number of gates serially placed due to the countermeasure for overflow of the transmission parallel data TxData or underflow of the reception parallel data RxData can be prevented. Also, the increase of the consumed electric power due to the increase of the number of gates can be prevented.

Embodiment 2

In the first embodiment, the transmission parallel data TxData is sampled substantially in synchronization with the trailing edges of the clock signal CLK-B, and the reception parallel data RxData is driven substantially in synchronization with the trailing edges of the clock signal CLK-B. Therefore, the sampling timing of the transmission parallel data TxData is the same as the drive timing of the reception parallel data RxData. Therefore, in the data transfer device of the first embodiment, assuming that the transmission parallel data TxData is driven after a time period equal to or longer than the time period 4CLK-A is elapsed from each leading edge of the clock signal CLK-B, the sampling of the transmission parallel data TxData cannot be performed substantially in synchronization with each trailing edge of the clock signal CLK-B and is delayed. In this case, the data transfer between the high speed operating block 1 and the low speed operating block 2 cannot be synchronously performed.

To solve this problem, for example, the enable timing of the load enable signal Ld-En is further shifted to a time lagged behind each leading edge of the clock signal CLK-B by a time period shorter than the time period 4CLK-A to change both the sampling timing of the transmission parallel data TxData and the drive timing of the reception parallel data RxData. However, in this method, though the problem for the sampling timing of the transmission parallel data TxData is solved, because a time period from the drive timing of the reception parallel data RxData to the sampling timing of the reception parallel data RxData is shortened, there is a case that the reception parallel data RxData cannot be undesirably sampled substantially in synchronization with each leading edge of the clock signal CLK-B.

Therefore, in the second embodiment, to solve the above-described problem, the sampling timing of the transmission parallel data TxData differs from the drive timing of the reception parallel data RxData. That is, the sampling timing of the transmission parallel data TxData is set according to the count signal Cnt[2], and the drive timing of the reception parallel data RxData is set according to the count signal Cnt[7] in the same manner as in the first embodiment.

FIG. 7 is a block diagram of a data transfer device according to the second embodiment of the present invention. The constituent elements, which are the same as those shown in FIG. 1, are indicated by the same reference numerals as those of the constituent elements shown in FIG. 1, and additional description of those constituent elements is omitted.

In FIG. 7, 21 indicates a holding register (or a data holding unit). In the serial data receiving operation, when the load enable signal Ld-En is set to the high level, the parallel data Sft-Regs[7:0] converted in the shift register 12 is received in the holding register 21, and the parallel data Sft-Regs[7:0] is held in the holding register 21 in the same manner as in the first embodiment. Also, in the serial data transmitting operation, values of the transmission parallel data TxData driven from the low power operating block 2 are sampled and held in the holding register 21. The transmission parallel data TxData is sampled when the load enable signal Ld-En is set to an enable state (or the high level).

22 indicates a sampling circuit (or a load enable signal producing unit) for producing a load enable signal Ld-En which is set to the high level in response to the count signal Cnt[2] in the serial data transmitting operation and is set to the high level in response to the count signal Cnt[7] in the serial data receiving operation. The parallel data Sft-Regs[7:0] output from the shift register 12 is held in the holding register 21 in response to the load enable signal Ld-En set to the high level, and the transmission parallel data TxData transferred from the low speed operational block 2 is sampled in the holding register 21 in response to the load enable signal Ld-En set to the high level.

Figure 8:
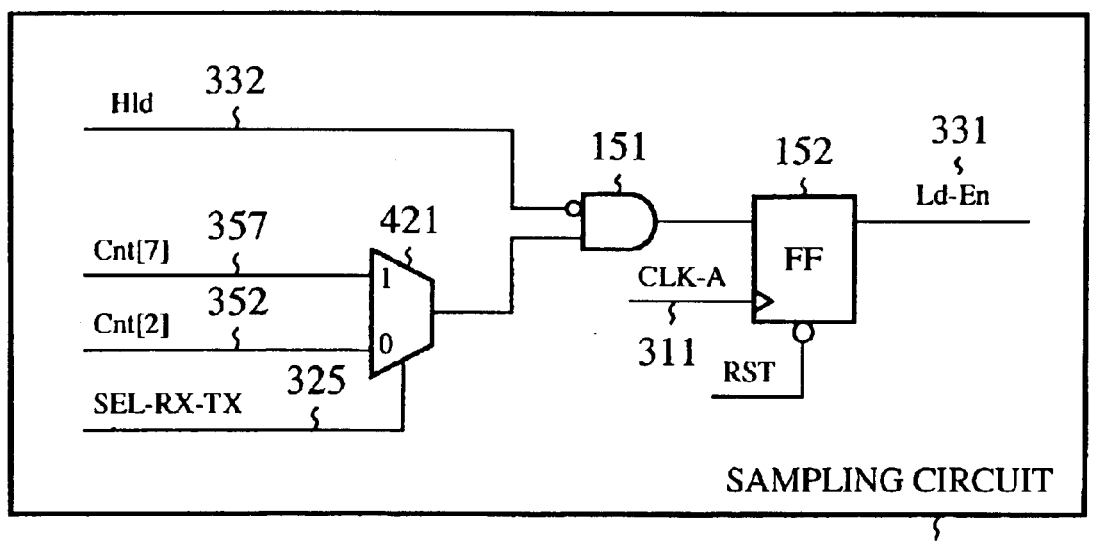
FIG. 8 is a circuit view of a sampling circuit shown in FIG. 7.

The configuration of the sampling circuit 22 is shown in FIG. 8 in detail. In FIG. 8, 421 indicates a selector for selecting the count signal cnt[2] in the serial data transmitting operation according to a transfer mode signal SEL-RX-TX set to "0" and selecting the count signal Cnt[7] in the serial data receiving operation according to a transfer mode signal SEL-RX-TX set to "1". The other constituent elements indicated by the same reference numerals as those in FIG. 3 are the same as those shown in FIG. 3.

An operation of the sampling circuit 22 will be described below. The enable timing (or high level timing) of the load enable signal Ld-En in the serial data transmitting operation differs from that in the serial data receiving operation. In the sampling circuit 15 of the first embodiment, when both the high level of the count signal Cnt[7] and the low level of the holding signal Hld are satisfied, the load enable signal Ld-En is set to the high level in both the transmitting and receiving operations. In contrast, in the sampling circuit 22 of the second embodiment, the count signal Cnt[7] is selected in the serial data receiving operation and is input to the AND gate 151, and the count signal Cnt[2] is selected in the serial data transmitting operation and is input to the AND gate 151. Therefore, the load enable signal Ld-En is set to the high level in the serial data receiving operation when both the high level of the count signal Cnt[7] and the low level of the holding signal Hld are satisfied, and the load enable signal Ld-En is set to the high level in the serial data transmitting operation when both the high level of the count signal Cnt[2] and the low level of the holding signal Hld are satisfied.

Also, the sampling circuit 22 has a function for producing a shift enable signal Sft-En. In the serial data transmitting operation, the shift enable signal Sft-En is set to the low level in response to the count signal Cnt[3] set to the high level (or the count value of "3") when the holding signal Hld is set to the low level, and the shift enable signal Sft-En is set to the high level when the count signal Cnt[3] is set to the low level due to the count value other than "3". When the holding signal Hld is set to the high level, the level of the shift enable signal Sft-En is not changed, and the level of the shift enable signal Sft-En set just before the setting of the high level of the holding signal Hld is held. In contrast, in the serial data receiving operation, the shift enable signal Sft-En is always set to the high level.

Next, an operation of the data transfer device will be described below.

An operation of the data transfer device in the serial data receiving operation is the same as that in the first embodiment. In contrast, in the serial data transmitting operation of the second embodiment, the transmission parallel data TxData is not directly fetched (or sampled) from the low speed operating block 2 to the shift register 12 but is fetched to the holding register 21. The transmission parallel data TxData fetched to the holding register 21 is fetched from the holding register 21 to the shift register 12 in response to the shift enable signal Sft-En set to the low level.

FIG. 9 is a timing chart of various signals showing the serial data transmitting operation of the data transfer device.

In the serial data transmitting operation, the transmission parallel data TxData is driven in the low speed operating block 2 in synchronization with each leading edge of the clock signal CLK-B in the same manner as in the first embodiment. The leading edges of the clock signal CLK-B are synchronized with the leading edges of the pulses C2, C10 and c19 of the clock signal CLK-A. Also, the load enable signal Ld-En is changed to the high level in response to the count value of "2" (the high level of the count signal Cnt[2]) obtained in the counter 16. The load enable signal Ld-En is set to the high level in response to the pulses C8 and c16 of the clock signal CLK-A. Therefore, the transmission parallel data TxData is sampled in the holding register 21 after a time period 7CLK-A of seven pulses of the clock signal CLK-A is elapsed from each leading edge of the clock signal CLK-B. The transmission parallel data TxData is sampled in response to the leading edges of the pulses C1, C9 and C17 of the clock signal CLK-A.

Also, the shift enable signal Sft-En is set to the low level in the time periods of the pulses C1, C9 and C17 of the clock signal CLK-A in response to the count signal Cnt[3] set to the high level. The transmission parallel data TxData sampled in the holding register 21 is sent to the shift register 12 in response to the shift enable signal Sft-En set to the low level in the sampling circuit 22. Thereafter, the shift enable signal Sft-En is changed to the high level, the right shift for the transmission parallel data TxData is performed in the shift register 12 in response to the shift enable signal Sft-En set to the high level, and serial data Sft-Regs[0] are produced from the transmission parallel data TxData. Thereafter, in the same manner as in the first embodiment, the output serial data SDOUT produced from serial data Sft-Regs[0] is transmitted to the bus 324.

As is described above, following effects can be obtained in the second embodiment.

Because the enable timing of the load enable signal Ld-En in the serial data transmitting operation differs from that in the serial data receiving operation, the sampling timing of the transmission parallel data TxData transferred from the low speed operating block 2 to the high speed operating block 1 can be appropriately set, and the drive timing of the reception parallel data RxData transferred from the high speed operating block 1 to the low speed operating block 2 can be appropriately set. Therefore, even though the transmission parallel data TxData is driven in the low speed operating block 2 after a time period equal to or longer than the time period 4CLK-A is elapsed from each leading edge of the clock signal CLK-B, the transmission parallel data TxData can be reliably sampled in the high speed operating block 1. Accordingly, it is not required to perform the countermeasure for the asynchronous data transfer or to adjust a clock skew between the clock signals CLK-A and CLK-B.

In the second embodiment, the transmission parallel data TxData is not directly fetched from the low speed operating block 2 to the shift register 12 but is fetched to the holding register 21. However, it is applicable that the transmission parallel data TxData be directly fetched from the low speed operating block 2 to the shift register 12. In this case, the shift enable signal Sft-En is not required.

Also, in the second embodiment, though the enable timing of the load enable signal Ld-En in the serial data transmitting operation differs from that in the serial data receiving operation, the load enable signal Ld-En is used in common for both the serial data transmitting operation and the serial data receiving operation. However, it is applicable that both a transmission load enable signal for the serial data transmitting operation and a reception load enable signal for the serial data receiving operation be used on condition that the enable timing of the transmission load enable signal differs from that of the reception load enable signal.

Embodiment 3

In the first and second embodiments, after the manufacturing of the data transfer device, the sampling timing of the transmission parallel data TxData determined due to the count signal Cnt[7] or Cnt[2] is fixed with respect to the clock signal CLK-B, and the drive timing of the reception parallel data RxData determined due to the count signal Cnt[7] is fixed with respect to the clock signal CLK-B. In contrast, the sampling timing of the transmission parallel data TxData and the drive timing of the reception parallel data RxData are arbitrarily changed according to a selection signal set in a software architecture or set at an external terminal.

Figure 10:
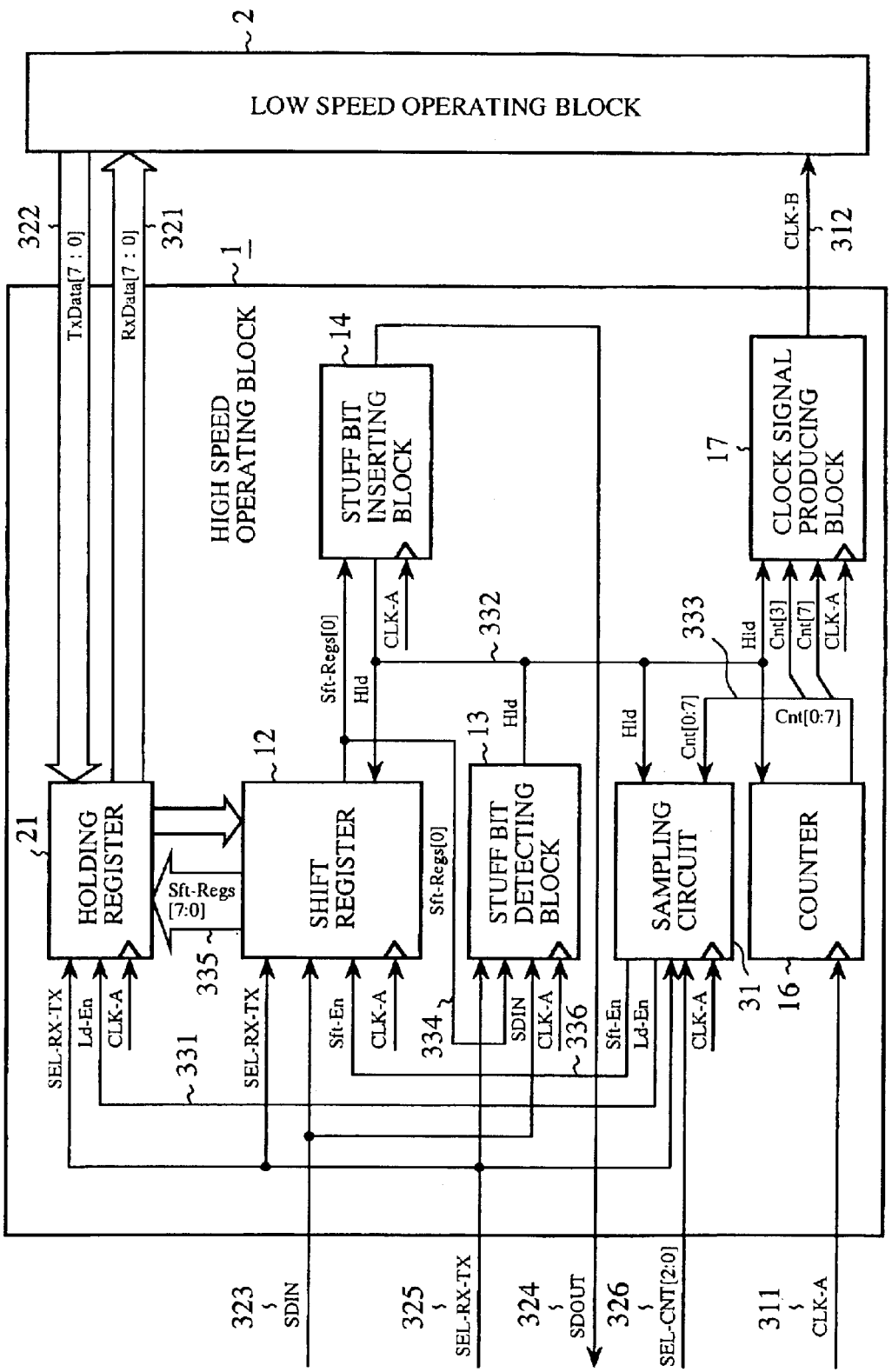
FIG. 10 is a block diagram of a data transfer device according to a third embodiment of the present invention.

FIG. 10 is a block diagram of a data transfer device according to the third embodiment of the present invention. The constituent elements, which are the same as those shown in FIG. 7, are indicated by the same reference numerals as those of the constituent elements shown in FIG. 7, and additional description of those constituent elements is omitted.

In FIG. 10, 31 indicates a sampling circuit (or a load enable signal producing unit) for producing a load enable signal Ld-En which is set to the high level in response to the count signal Cnt[0], Cnt[1], Cnt[2], Cnt[3], Cnt[4], Cnt[5] or Cnt[6] in the serial data transmitting operation and is set to the high level in response to the count signal Cnt[7] in the serial data receiving operation. The parallel data Sft-Regs [7:0] output from the shift register 12 is held in the holding register 21 in response to the load enable signal Ld-En set to the high level, and the transmission parallel data TxData transmitted from the low speed operational block 2 is sampled in the holding register 21 in response to the load enable signal Ld-En set to the high level.

Figure 11:
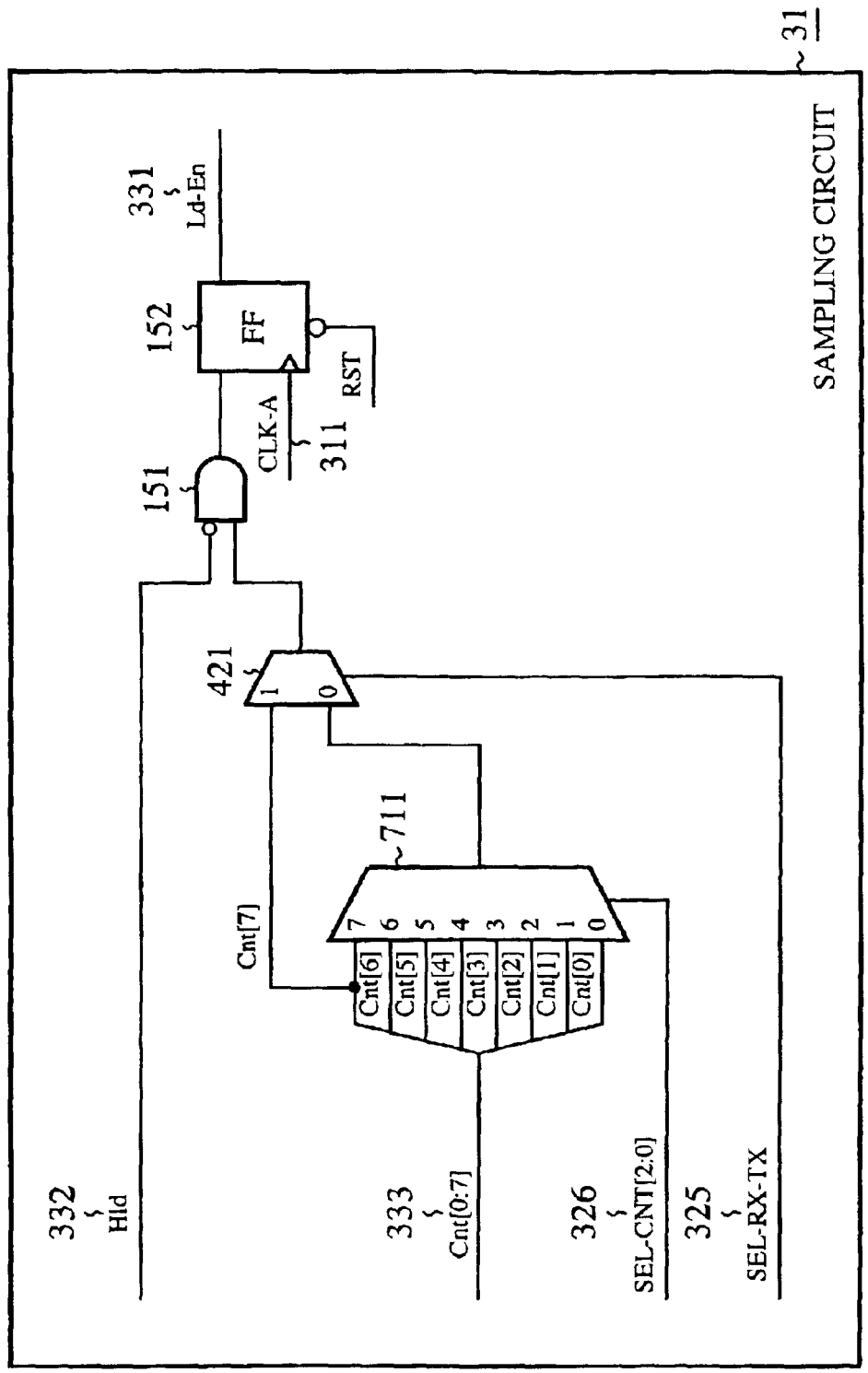
FIG. 11 is a circuit view of a sampling circuit shown in FIG. 10.

The configuration of the sampling circuit 31 is shown in FIG. 11 in detail. In FIG. 11, 711 indicates a selector for selecting the count signal Cnt[0], Cnt[1], Cnt[2], Cnt[3], Cnt[4], Cnt[5], Cnt[6] or Cnt[7] according to a value of an enable timing setting signal (or selection signal) SEL-CNT set in a software architecture or set at an external terminal. The other constituent elements indicated by the same reference numerals as those in FIG. 8 are the same as those shown in FIG. 8.

Next, an operation of the data transfer device will be described below.

Figure 12:
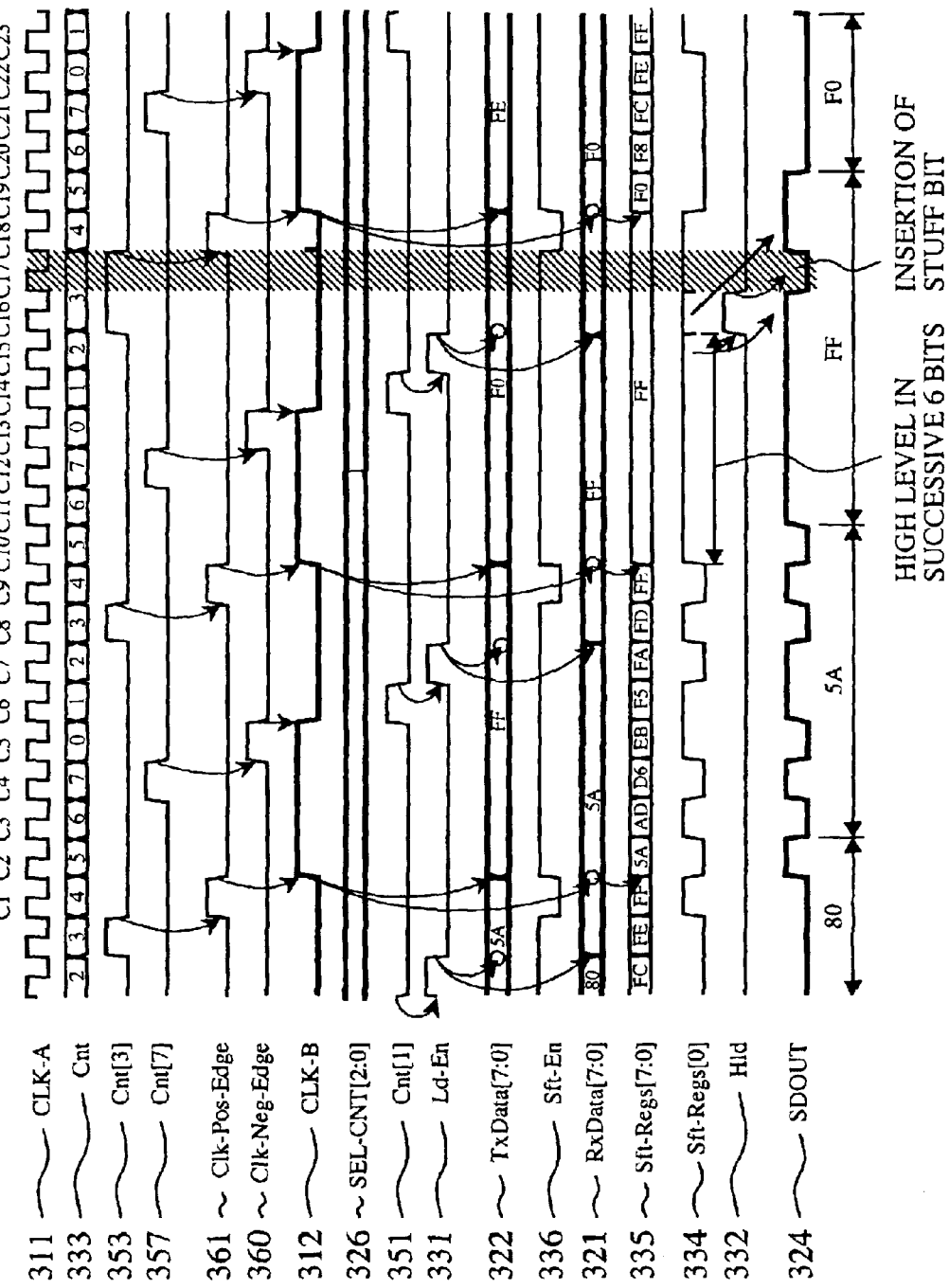
FIG. 12 is a timing chart of various signals used in the data transfer device shown in FIG. 10 in a serial data transmitting operation.

FIG. 12 is a timing chart of various signals used in the data transfer device in the serial data transmitting operation. In the timing chart shown in FIG. 12, the sampling timing of the transmission parallel data TxData is, for example, determined due to the count signal Cnt[1].

In the serial data transmitting operation, the enable timing setting signal SEL-CNT indicating the value of "1" is set according to a software architecture or is set at an external terminal, and the enable timing setting signal SEL-CNT indicating the value of "1" is input to the selector 711. In this case, the count signal Cnt[1] is selected in the selector 711, and the load enable signal Ld-En is set to the high level in response to the count signal Cnt[1] set to the high level. Therefore, the transmission parallel data TxData is sampled in the holding register 21 after a time period 6CLK-A of six pulses of the clock signal CLK-A is elapsed from each leading edge of the clock signal CLK-B. The transmission parallel data TxData is, for example, sampled in response to the leading edges of the pulses C8 and C16 of the clock signal CLK-A in cases where the clock signal CLK-B has the leading edges synchronized with the leading edges of the pulses C2 and C10 of the clock signal CLK-A.

Also, in another example, the enable timing setting signal SEL-CNT indicating the value of "2" is set according to the software architecture or is set at the external terminal, and the enable timing setting signal SEL-CNT indicating the value of "2" is input to the selector 711. In this case, the count signal Cnt[2] is selected in the selector 711, and the load enable signal Ld-En is set to the high level in response to the count signal Cnt[2] set to the high level. Therefore, in the same manner as in the second embodiment (shown in FIG. 9), the transmission parallel data TxData is sampled in the holding register 21 after the time period 7CLK-A of seven pulses of the clock signal CLK-A is elapsed from each leading edge of the clock signal CLK-B.

As is described above, following effects can be obtained in the third embodiment. Because the sampling timing of the transmission parallel data TxData and the drive timing of the reception parallel data RxData can be arbitrarily set according to the enable timing setting signal SEL-CNT set in the software architecture or set at the external terminal, the sampling timing of the transmission parallel data TxData and the drive timing of the reception parallel data RxData can be changed after the manufacturing of the data transfer device. For example, after the data transfer device is arranged on a large scale integrated circuit, there is a trouble that the data transfer synchronized with the clock signal CLK-B cannot be performed between the high speed operating block 1 and the low speed operating block 2 due to the difference between an expected delay and an actual delay of data. Even though this trouble occurs, because the sampling timing of the transmission parallel data TxData and the drive timing of the reception parallel data RxData can be arbitrarily changed according to the enable timing setting signal SEL-CNT set in the software architecture or set at the external terminal, the data transfer synchronized with the clock signal CLK-B can be reliably performed between the high speed operating block 1 and the low speed operating block 2.

In the third embodiment, the transmission parallel data TxData is not directly fetched from the low speed operating block 2 to the shift register 12 but is fetched to the holding register 21. However, it is applicable that the transmission parallel data TxData be directly fetched from the low speed operating block 2 to the shift register 12 in the same manner as in the first embodiment by replacing the sampling circuit 31 with the sampling circuit 15 of the first embodiment. In this case, no enable timing setting signal SEL-CNT is used.

Embodiment 4

In the second and third embodiments, the sampling timing of the transmission parallel data TxData and the drive timing of the reception parallel data RxData for the clock signal CLK-B are adjusted by changing the enable timing of the load enable signal Ld-En for the clock signal CLK-B. Therefore, the sampling timing of the transmission parallel data TxData and the drive timing of the reception parallel data RxData differ from the timing of the leading and trailing edges of the clock signal CLK-B. In other words, because the leading edges of the clock signal CLK-B and the trailing edges of the clock signal CLK-B are formed in response to the count value of "3" (the high level of the count signal Cnt[3]) and the count value of "7" (the high level of the count signal Cnt[7]) respectively, the sampling timing of the transmission parallel data TxData and the drive timing of the reception parallel data RxData for the clock signal CLK-B are adjusted by changing the count signal determining the enable timing of the load enable signal Ld-En to an appropriate count signal.

In contrast, in the fourth embodiment, the timing of the leading edges of the clock signal CLK-B and the trailing edges of the clock signal CLK-B for the clock signal CLK-B are adjusted while the enable timing of the load enable signal Ld-En is set according to the count signal Cnt[7] in the same manner as in the first embodiment, and the sampling timing of the transmission parallel data TxData and the drive timing of the reception parallel data RxData for the clock signal CLK-B are adjusted to shorten or lengthen the time period from the drive timing of the reception parallel data RxData to the sampling timing of the reception parallel data RxData and to lengthen or shorten the time period from the drive timing of the transmission parallel data TxData to the sampling timing of the transmission parallel data TxData.

For example, a time period 4CLK-A from the timing of the leading edge of the clock signal CLK-B to the sampling timing of the transmission parallel data TxData is insufficient in a data transfer device arranged on a type of large scale integrated circuit, and a time period 4CLK-A from the drive timing of the reception parallel data RxData to the timing of the leading edge of the clock signal CLK-B is sufficient in the data transfer device arranged on the type of large scale integrated circuit. In this case, the data transfer device according to the fourth embodiment is designed to shorten the time period from the drive timing of the reception parallel data RxData to the sampling timing of the reception parallel data RxData and to lengthen the time period from the drive timing of the transmission parallel data TxData to the sampling timing of the transmission parallel data TxData.

Figure 13:
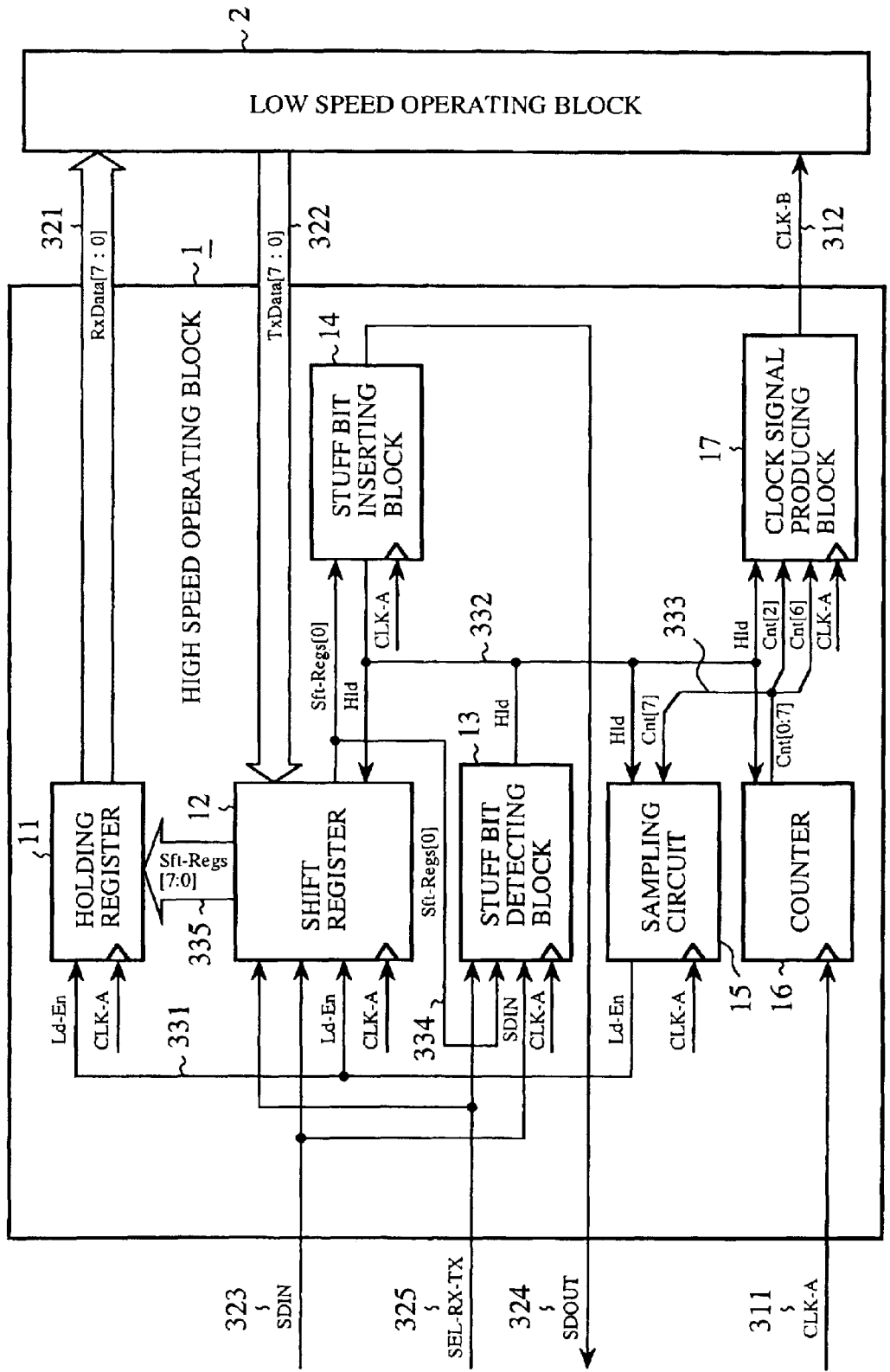
FIG. 13 is a block diagram of a data transfer device according to a fourth embodiment of the present invention.

FIG. 13 is a block diagram of a data transfer device according to the fourth embodiment of the present invention. The constituent elements, which are the same as those shown in FIG. 1, are indicated by the same reference numerals as those of the constituent elements shown in FIG. 1, and additional description of those constituent elements is omitted.

In FIG. 13, the count signal Cnt[2] and the count signal Cnt[6] are input to the clock signal producing block 17 in place of the count signal Cnt[3] and the count signal Cnt[7] used in the first embodiment.

Next, an operation of the data transfer device will be described below.

Figure 14:
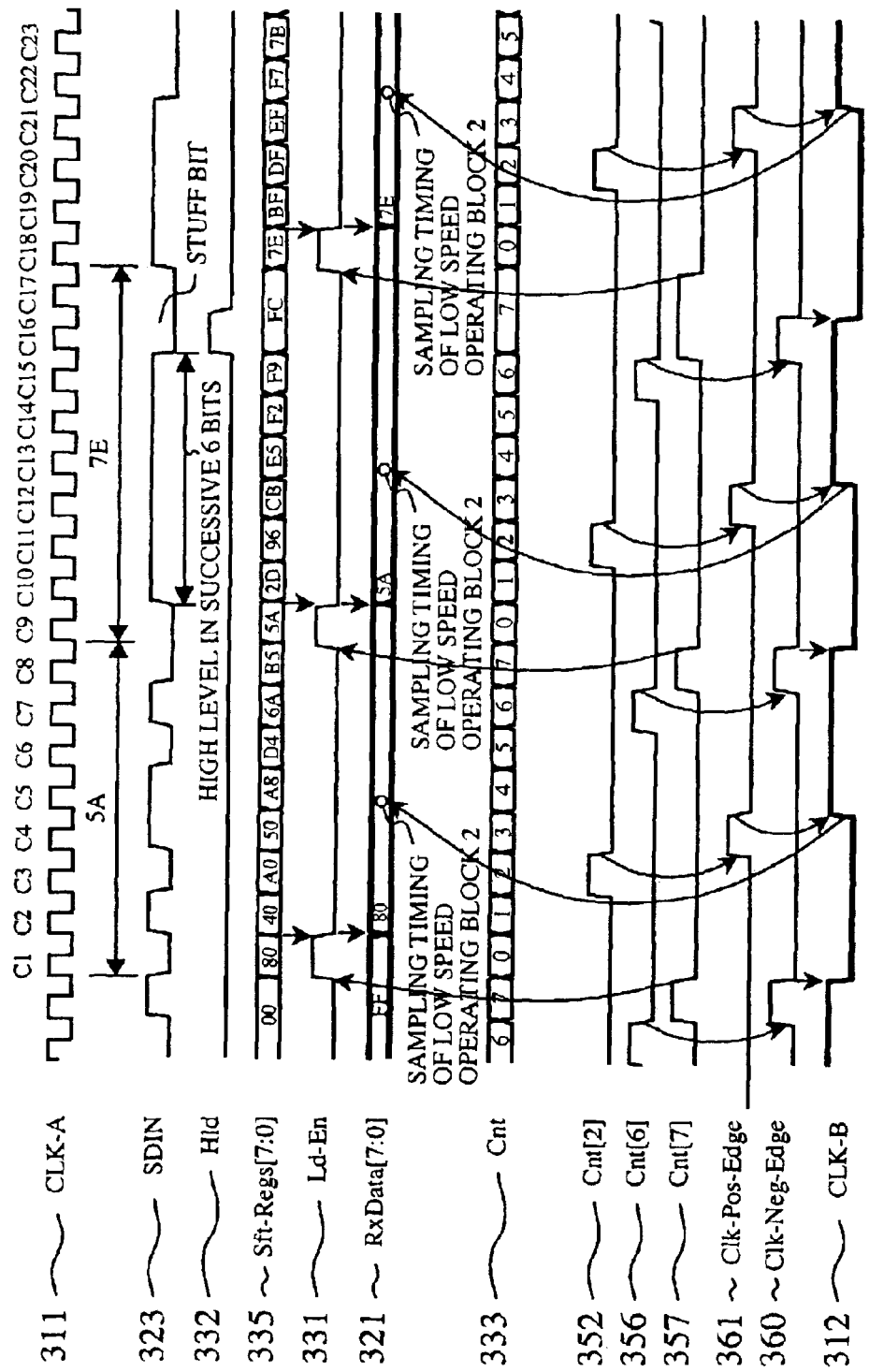
FIG. 14 is a timing chart of various signals used in the data transfer device shown in FIG. 13 in a serial data receiving operation.
Figure 15:
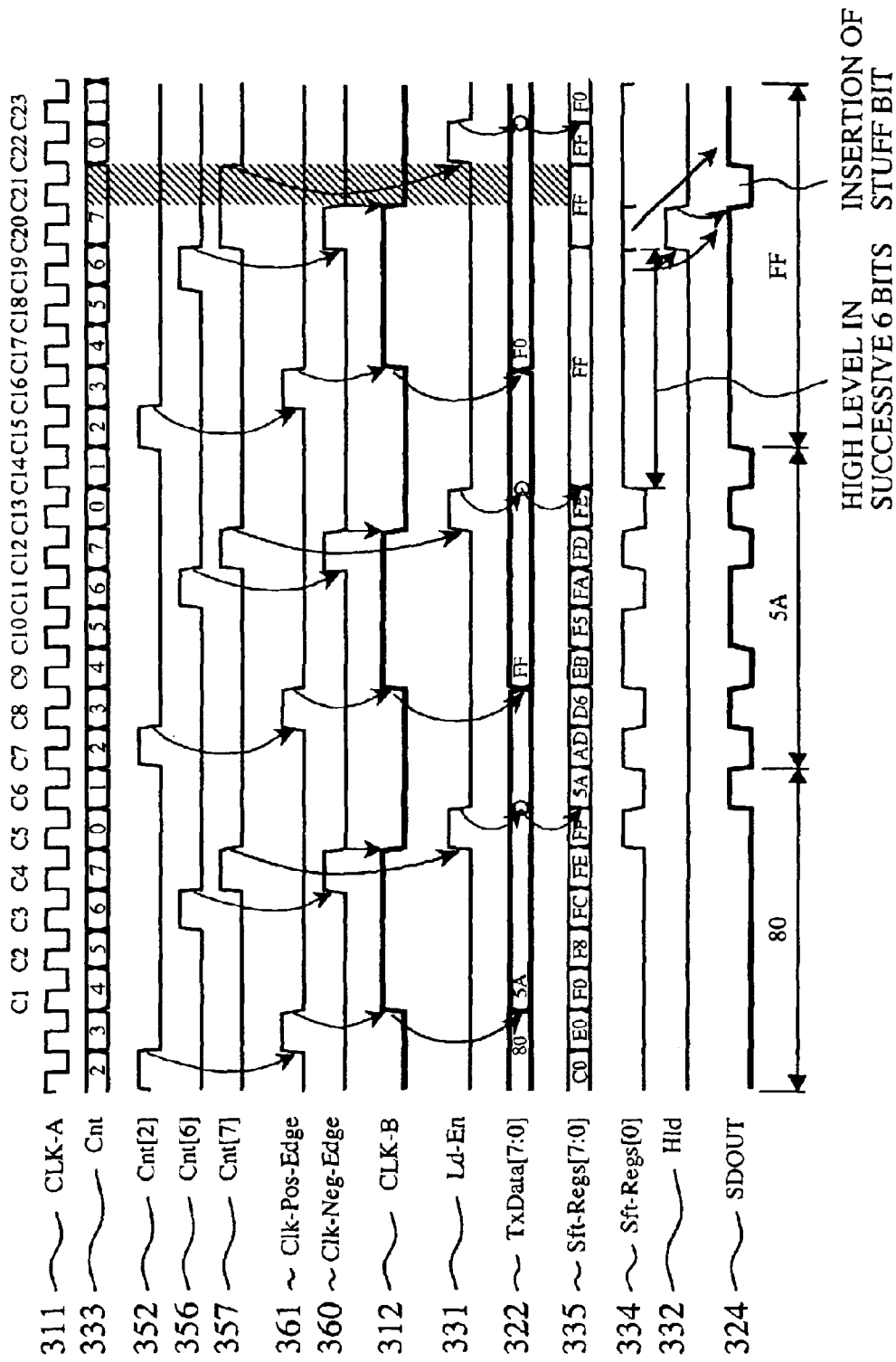
FIG. 15 is a timing chart of various signals used in the data transfer device shown in FIG. 13 in a serial data transmitting operation.

FIG. 14 is a timing chart of various signals showing the serial data receiving operation of the data transfer device. FIG. 15 is a timing chart of various signals showing the serial data transmitting operation of the data transfer device.

In contrast to the first embodiment in which the leading edges of the clock signal CLK-B and the trailing edges of the clock signal CLK-B are formed in response to the count value of "3" and the count value of "7", in the fourth embodiment, the leading edges of the clock signal CLK-B and the trailing edges of the clock signal CLK-B are formed in response to the count value of "2" and the count value of "6". Also, the load enable signal Ld-En is set to the enable state in response to the count value of "7". Therefore, in the fourth embodiment, the timing of the leading and trailing edges of the clock signal CLK-B for the enable timing of the load enable signal Ld-En is earlier than that in the first embodiment by one pulse of the clock signal CLK-A.

For example, as shown in FIG. 14, in cases where the reception parallel data RxData is driven in response to each of the pulses C2, C10 and C19 of the clock signal CLK-A later than the leading edges of the clock signal CLK-B by one pulse of the clock signal CLK-A, because the reception parallel data RxData is sampled in the low speed operating block 2 in synchronization with each leading edge of the clock signal CLK-B, the sampling timing of the reception parallel data RxData is placed after three pulses (or three cycles) of the clock signal CLK-A from the drive timing of the reception parallel data RxData. That is, the reception parallel data RxData is sampled at the pulses C5, C13 and C22 of the clock signal CLK-A.

Also, as shown in FIG. 15, the transmission parallel data TxData is driven in synchronization with the leading edges of the clock signal CLK-B synchronized with the leading edges of the pulses C1, C9 and C17 of the clock signal CLK-A respectively. In this case, because the timing of the trailing edges of the clock signal CLK-B is earlier than the enable timing of the load enable signal Ld-En by one pulse of the clock signal CLK-A, in cases where no holding signal set to the high level is received in the sampling circuit 15 in a time period from the drive timing of the transmission parallel data TxData to the sampling timing of the transmission parallel data TxData, the sampling timing of the transmission parallel data TxData sampled in response to the load enable signal Ld-En set to the high level is placed after five pulses (or five cycles) of the clock signal CLK-A from the drive timing of the transmission parallel data TxData. That is, the sampling timing of the transmission parallel data TxData is synchronized with the leading edges of the pulses C6 and C14 of the clock signal CLK-A. In cases where the holding signal set to the high level is received in the sampling circuit 15 in a time period from the drive timing of the transmission parallel data TxData to the sampling timing of the transmission parallel data TxData, because one stuff bit is inserted into the transmission parallel data TxData in the stuff bit inserting block 14 during one pulse of the clock signal CLK-A, the sampling timing of the transmission parallel data TxData is placed after six pulses (or six cycles) of the clock signal CLK-A from the drive timing of the transmission parallel data TxData. That is, the sampling timing of the transmission parallel data TxData is synchronized with the leading edge of the pulse C23 of the clock signal CLK-A.

In the fourth embodiment, the set of count signals Cnt[2] and Cnt[6] (the count value of "2" and the count value of "6") are used in the clock signal producing block 17 to set the timing of the leading edges of the clock signal CLK-B and the timing of the trailing edges of the clock signal CLK-B. However, it is applicable that a set of count signals Cnt[1] and Cnt[5] or a set of count signals Cnt[0] and Cnt[4] be used in the clock signal producing block 17 to set the timing of the leading edges of the clock signal CLK-B and the timing of the trailing edges of the clock signal CLK-B. In this case, the timing of the leading and trailing edges of the clock signal CLK-B is earlier than the enable timing of the load enable signal Ld-En by two or three pulses of the clock signal CLK-A.

As is described above, following effects can be obtained in the fourth embodiments. Even though the time period 4CLK-A from the timing of the leading edge of the clock signal CLK-B to the sampling timing of the transmission parallel data TxData is insufficient for the data transfer of the transmission parallel data TxData synchronized with the clock signal CLK-B, in cases where the time period 4CLK-A from the drive timing of the reception parallel data RxData to the timing of the leading edge of the clock signal CLK-B is sufficient for the data transfer of the reception parallel data RxData synchronized with the clock signal CLK-B, the timing of the leading and trailing edges of the clock signal CLK-B for the enable timing of the load enable signal Ld-En is advanced as compared with in the first embodiment. Accordingly, even though the time period 4CLK-A from the timing of the leading edge of the clock signal CLK-B to the sampling timing of the transmission parallel data TxData is insufficient, the synchronization data transfer between the high speed operating block 1 and the low speed operating block 2 can be reliably performed while removing or inserting the stuff bit from/into the reception parallel data RxData or the transmission parallel data TxData.

In the fourth embodiment, the timing of the leading and trailing edges of the clock signal CLK-B for the enable timing of the load enable signal Ld-En is advanced as compared with in the first embodiment. However, it is applicable that the timing of the leading and trailing edges of the clock signal CLK-B for the enable timing of the load enable signal Ld-En is delayed as compared with in the first embodiment by using the count value of "4" and the count value of "0" in the clock signal producing block 17 to set the timing of the leading edges of the clock signal CLK-B and the timing of the trailing edges of the clock signal CLK-B.

Also, in the fourth embodiment, the enable timing of the load enable signal Ld-En is set according to the count signal Cnt[7] in both the serial data receiving and transmitting operations. However, in the same manner as in the second embodiment, it is applicable that the count signal for setting the enable timing of the load enable signal Ld-En in the serial data receiving operation differ from that in the serial data transmitting operation. In this case, the time period from the drive timing of the reception parallel data RxData to the sampling timing of the reception parallel data RxData and the time period from the drive timing of the transmission parallel data TxData to the sampling timing of the transmission parallel data TxData can be independently and precisely set.

Embodiment 5

The timing of the leading and trailing edges of the clock signal CLK-B set according to the count signal Cnt[3] and the count signal Cnt[7] in the first embodiment cannot be changed after the manufacturing of the data transfer device. Also, the timing of the leading and trailing edges of the clock signal CLK-B set according to the count signal Cnt[2] and the count signal Cnt[6] in the fourth embodiment cannot be changed after the manufacturing of the data transfer device.

In contrast, in a fifth embodiment, the timing of the leading and trailing edges of the clock signal CLK-B is set so as to be adjustable according to a selection signal set in a software architecture or set at an external terminal after the manufacturing of a data transfer device.

Figure 16:
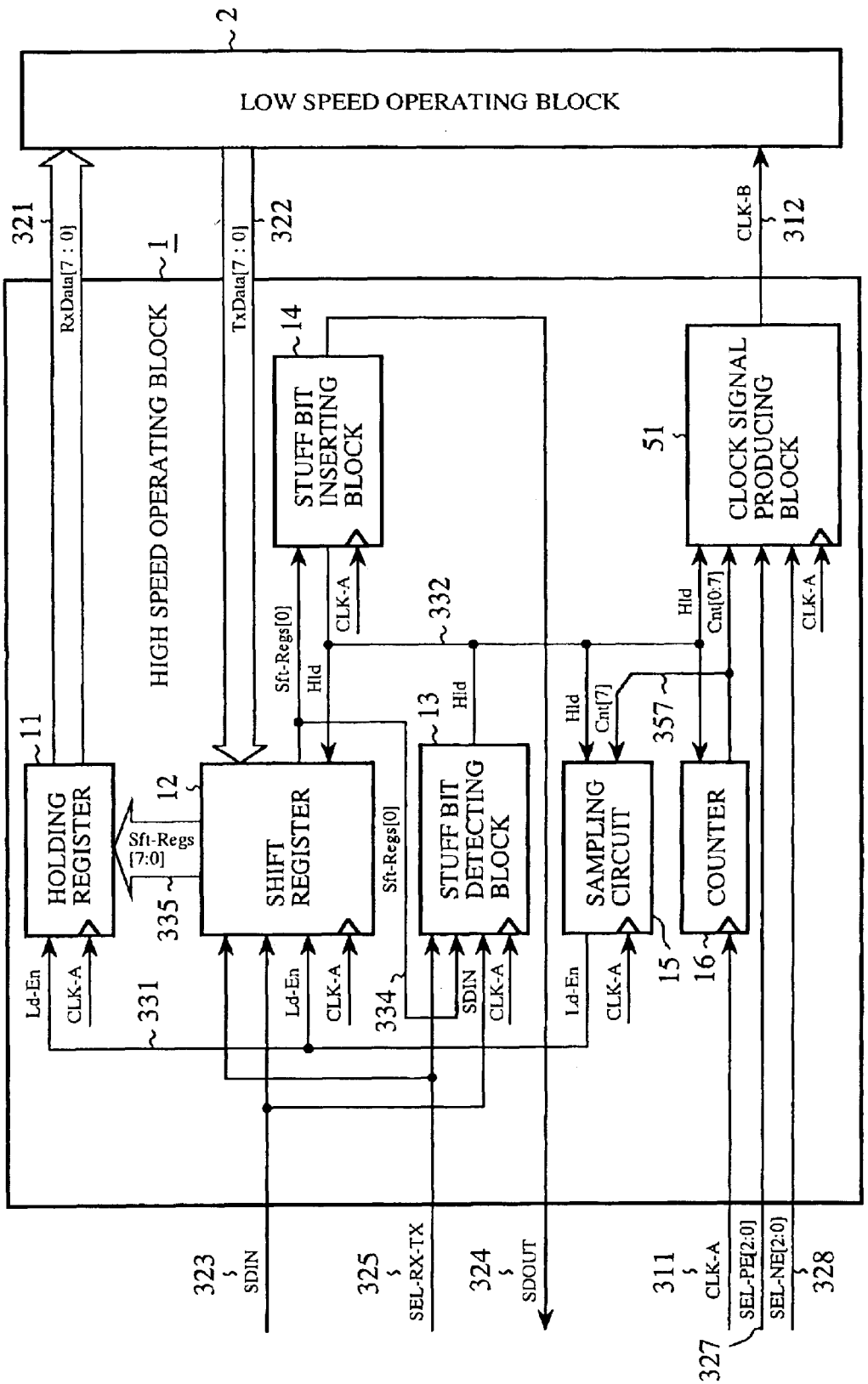
FIG. 16 is a block diagram of a data transfer device according to a fifth embodiment of the present invention.

FIG. 16 is a block diagram of a data transfer device according to the fifth embodiment of the present invention. The constituent elements, which are the same as those shown in FIG. 1, are indicated by the same reference numerals as those of the constituent elements shown in FIG. 1, and additional description of those constituent elements is omitted.

In FIG. 16, 51 indicates a clock signal producing block (or a clock signal producing unit) for producing a clock signal CLK-B according to the count signal Cnt[0:7], the clock signal CLK-A, a CLK-B leading edge timing setting signal SEL-PE and a CLK-B trailing edge timing setting signal SEL-NE. Each of both the leading edge timing setting signal SEL-PE and the trailing edge timing setting signal SEL-NE is set to a value of "0", "1", "2", "3", "4", "5", "6" or "7". The signal is readable and writable in a register according to a software architecture, or the signal is set at an external terminal.

The configuration of the clock signal producing block 51 is shown in FIG. 17 in detail. In FIG. 17, 510 indicates a selector for selecting the count signal Cnt[0], Cnt[1], Cnt[2], Cnt[3], Cnt[4], Cnt[5], Cnt[6] or Cnt[7] according to the value of the trailing edge timing setting signal SEL-NE. 511 indicates a selector for selecting the count signal Cnt[0], Cnt[1], Cnt[2], Cnt[3], Cnt[4], Cnt[5], Cnt[6] or Cnt[7] according to the value of the leading edge timing setting signal SEL-PE. The count signal selected in the selector 510 is input to the AND gate 161, and the count signal selected in the selector 511 is input to the AND gate 163. The other constituent elements indicated by the same reference numerals as those in FIG. 4 are the same as those shown in FIG. 4.

Next, an operation of the data transfer device will be described below.

Figure 18:
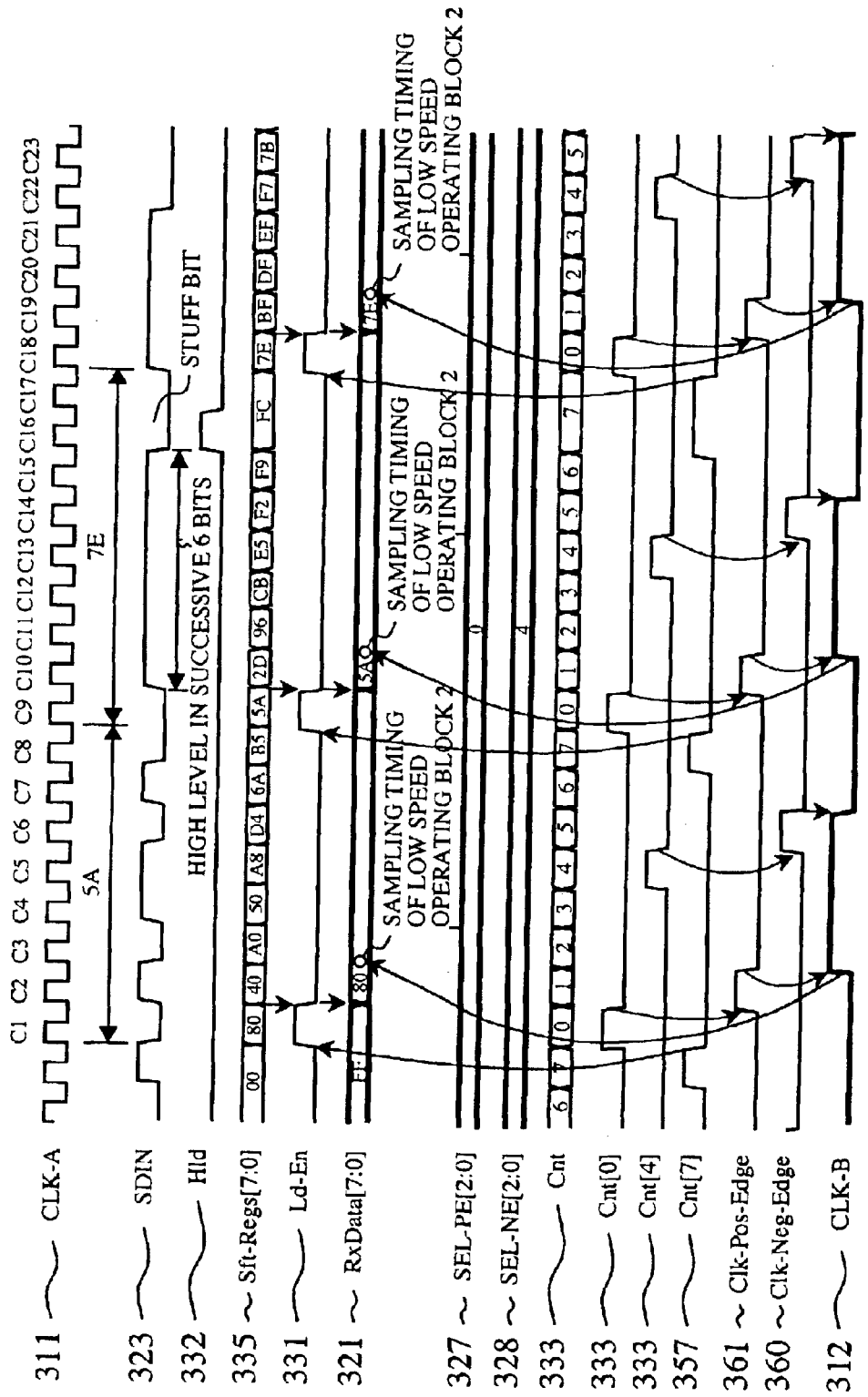
FIG. 18 is a timing chart of various signals used in the data transfer device shown in FIG. 17 in a serial data receiving operation.
Figure 19:
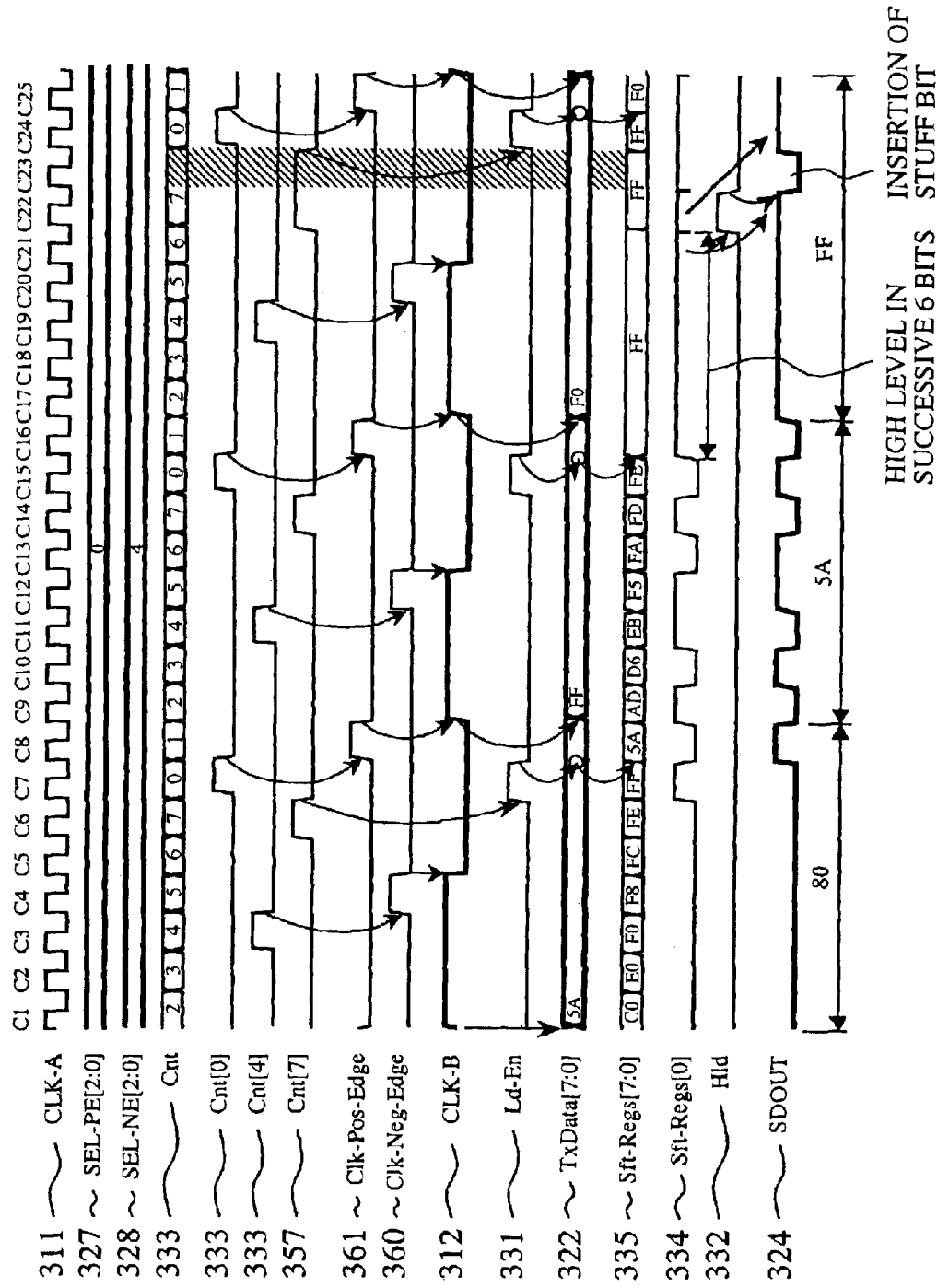
FIG. 19 is a timing chart of various signals used in the data transfer device shown in FIG. 17 in a serial data transmitting operation.
Figure 20:
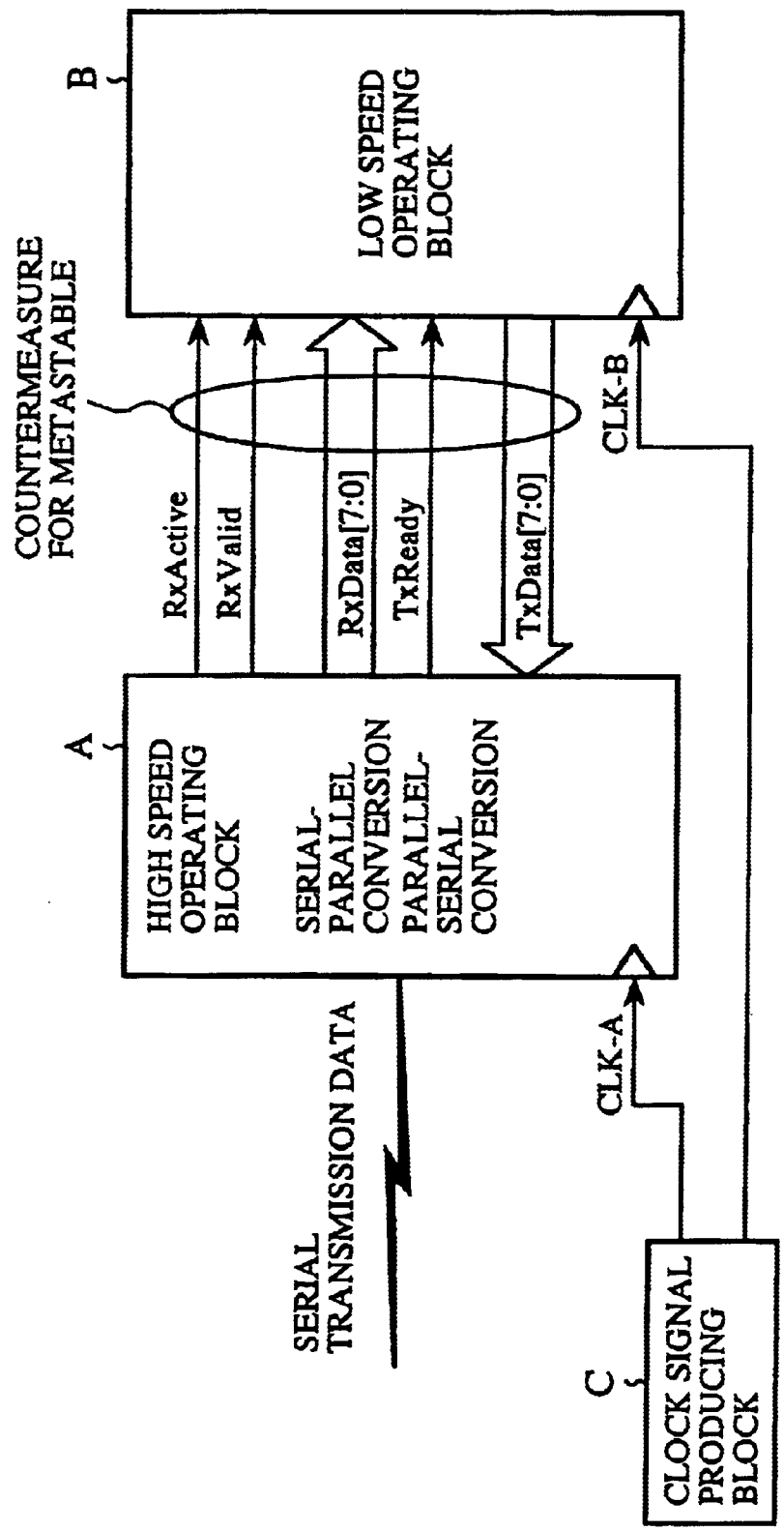
FIG. 20 is a block diagram showing a conventional data transfer device.

FIG. 18 is a timing chart of various signals used in the serial data receiving operation of the data transfer device. FIG. 19 is a timing chart of various signals used in the serial data transmitting operation of the data transfer device. To obtain the timing charts shown in FIG. 18 and FIG. 19, the leading edge timing setting signal SEL-PE is set to the value of "0" to input the count signal Cnt[0] to the AND gate 163, and the trailing edge timing setting signal SEL-NE is set to the value of "4" to input the count signal Cnt[4] to the AND gate 161.

In this case, in the serial data receiving operation shown in FIG. 18, the holding signal Hld is set to the high level at the pulse C16, the count signal Cnt[0] is set to the high level at the pulses C1, C9 and C18 of the clock signal CLK-A, the count signal Cnt[4] is set to the high level at the pulses C5, C13 and C22 of the clock signal CLK-A, the leading enable signal Clk-Pos-Edge is set to the high level in response to the count signal Cnt[0] at the pulses C2, C10 and C19 of the clock signal CLK-A, the trailing enable signal Clk-Neg-Edge is set to the high level in response to the count signal Cnt[4] at the pulses C6, C14 and C23 of the clock signal CLK-A, the leading edges of the clock signal CLK-B synchronized with the leading edges of the pulses C3, C11 and C20 of the clock signal CLK-A are formed in response to the leading enable signal Clk-Pos-Edge, and the trailing edges of the clock signal CLK-B synchronized with the leading edges of the pulses C7, C15 and C24 of the clock signal CLK-A are formed in response to the trailing enable signal Clk-Neg-Edge.

Also, in the serial data transmitting operation shown in FIG. 19, the holding signal Hld is set to the high level at the pulse C22, the count signal Cnt[0] is set to the high level at the pulses C7, C15 and C24 of the clock signal CLK-A, the count signal Cnt[4] is set to the high level at the pulses C3, C11 and C19 of the clock signal CLK-A, the leading edges of the clock signal CLK-B synchronized with the leading edges of the pulses C1, C9 and C17 of the clock signal CLK-A are formed, and the trailing edges of the clock signal CLK-B synchronized with the leading edges of the pulses C5, C13 and C21 of the clock signal CLK-A are formed.

In this case, in the serial data receiving operation shown in FIG. 18, because the load enable signal Ld-En is set to the high level at the pulses C1, C9 and C18 of the clock signal CLK-A in response to the count signal Cnt[7], the drive timing of the reception parallel data RxData is synchronized with the leading edges of the pulses C2, C10 and C19 of the clock signal CLK-A, and the sampling timing of the reception parallel data RxData synchronized with the leading edges of the clock signal CLK-B is synchronized with the leading edges of the pulses C3, C11 and C20 of the clock signal CLK-A. Therefore, each sampling timing of the reception parallel data RxData is later than the drive timing of the reception parallel data RxData by one pulse of the clock signal CLK-A.

Also, in the serial data transmitting operation shown in FIG. 19, because the load enable signal Ld-En is set to the high level at the pulses C7, C15 and C24 of the clock signal CLK-A in response to the count signal Cnt[7], the sampling timing of the transmission parallel data TxData is synchronized with the leading edges of the pulses C8, C16 and C25 of the clock signal CLK-A in response to the load enable signal Ld-En, and the drive timing of the transmission parallel data TxData synchronized with the leading edges of the clock signal CLK-B is synchronized with the leading edges of the pulses C1, C9 and C17 of the clock signal CLK-A. Therefore, in cases where no holding signal is produced in the stuff bit detecting block 13 in a time period from the drive timing of the transmission parallel data TxData to the corresponding sampling timing of the transmission parallel data TxData, the sampling timing of the transmission parallel data TxData is later than the drive timing of the transmission parallel data TxData by the time period 7CLK-A of seven pulses of the clock signal CLK-A. Also, in cases where the holding signal is produced in the stuff bit detecting block 13 in a time period from the drive timing of the transmission parallel data TxData to the corresponding sampling timing of the transmission parallel data TxData, the sampling timing of the transmission parallel data TxData is later than the drive timing of the transmission parallel data TxData by a time period 8CLK-A of eight pulses of the clock signal CLK-A.

In the fifth embodiment, because the reception parallel data RxData is sampled after one pulse (or one cycle) of the clock signal CLK-A from the setting-up of the reception parallel data RxData in the holding register 11, a set-up time period of the reception parallel data RxData in the holding register 11 is not sufficient when the data transfer device is used for a type of large scale integrated circuit. In this case, the inventive idea of the second or third embodiment is combined with that of the fifth embodiment, and the set-up time period of the reception parallel data RxData is set to be sufficient regardless of the type of large scale integrated circuit.

Here, in cases where the trailing edge timing setting signal SEL-NE set to a value of "6" and the leading edge timing setting signal SEL-PE set to a value of "2" are input to the AND gates 161 and 163 respectively, the data transfer device is operated in the same manner as in the fourth embodiment.

As is described above, following effects can be obtained in the fifth embodiment.

Because the values of the trailing edge timing setting signal SEL-NE and the leading edge timing setting signal SEL-PE are set according to the software architecture or at the external terminal, the timing of the leading and trailing edges of the clock signal CLK-B can be changed after the manufacturing of the data transfer device.

For example, the high speed operating block 1 is manufactured while fixing a layout of the elements of the high speed operating block 1, and the low speed operating block 2 is manufactured while changeably setting a layout of the elements of the low speed operating block 2, and the data transfer devices are used for various types of large scale integrated circuits respectively. In this case, data delay in the low speed operating block 2 depends on process and/or technology of the type of large scale integrated circuit. Therefore, it is required to appropriately set an interface between the high speed operating block 1 and the low speed operating block 2 for each type of large scale integrated circuit, and it is required to adjust the performance of the high speed operating block 1 to compensate the timing delay in the interface between the high speed operating block 1 and the low speed operating block 2. In this case, assuming that the inventive idea of the first, second or fourth embodiment is adopted to adjust the performance of the high speed operating block 1, it takes a long time and high cost. However, in cases where the inventive idea of the fifth embodiment is adopted, the performance of the high speed operating block 1 can be reliably adjusted by appropriately setting the values of the trailing edge timing setting signal SEL-NE and the leading edge timing setting signal SEL-PE, and it is not required to change the layout of the elements of the high speed operating block 1.

What is claimed is:

1. A data transfer device, comprising:
    a high speed operating unit for receiving input serial data in a data receiving operation in synchronization with a first clock signal having a frequency corresponding to a high transmission speed, converting the input serial data into reception parallel data, and transmitting output serial data in a data transmitting operation in synchronization with the first clock signal; and
    a low speed operating unit for receiving the reception parallel data transferred from the high speed operating unit in synchronization with a second clock signal having a frequency lower than that of the first clock signal and transferring transmission parallel data to the high speed operating unit in synchronization with the second clock signal,
    wherein the high speed operating unit comprises:
        a count signal producing unit for circularly counting the number of pulses of the first clock signal in a count range corresponding to a prescribed clock cycle, and producing a plurality of count signals indicating count values currently obtained so as to include both a first count signal indicating a first count value and a second count signal indicating a second count value;
        a clock signal producing unit for producing the second clock signal by forming a first edge of each pulse in response to the first count signal produced by the count signal producing unit in synchronization with the first clock signal and forming a second edge of each pulse in response to the second count signal produced by the count signal producing unit in synchronization with the first clock signal, and transmitting the second clock signal to the low speed operating unit; and
        a data converting unit for receiving the input serial data in synchronization with the first clock signal in the serial data receiving operation, converting the input serial data into the reception parallel data in synchronization with the first clock signal, driving the reception parallel data in response to one of the count signals produced by the count signal producing unit so as to sample the reception parallel data in the low speed operating unit in synchronization with the second clock signal, sampling the transmission parallel data, which is driven by the low speed operating unit in synchronization with the second clock signal in the serial data transmitting operation, in response to one of the count signals produced by the count signal producing unit, converting the transmission parallel data into the output serial data in synchronization with the first clock signal, and transmitting the output serial data in synchronization with the first clock signal.

2. A data transfer device according to claim 1, wherein the count signal relating to the driving of the reception parallel data performed by the data converting unit in the serial data receiving operation is the same as the count signal relating to the sampling of the transmission parallel data performed by the data converting unit in the serial data transmitting operation.

3. A data transfer device according to claim 2, wherein the count signal relating to both the driving of the reception parallel data and the sampling of the transmission parallel data is the same as the second count signal produced by the count signal producing unit.

4. A data transfer device according to claim 2, wherein the count signal relating to both the driving of the reception parallel data and the sampling of the transmission parallel data differs from the second count signal produced by the count signal producing unit.

5. A data transfer device according to claim 1, wherein the clock signal producing unit comprises:
    a selector for selecting one pair of count signals indicating one pair of count values from the count signals produced by the count signal producing unit according to a selection signal set in a software architecture or at an external terminal; and
    a clock signal producing circuit for receiving the count signals selected by the selector as both the first clock signal and the second clock signal and producing the second clock signal from the count signals.

6. A data transfer device according to claim 5, wherein the count values of the count signals selected by the selector are different from each other by half of the number of pulses of the first clock signal existing in the prescribed clock cycle.

7. A data transfer device according to claim 1, further comprising a load enable signal producing unit for producing a load enable signal in response to one of the count signals produced by the count signal producing unit in synchronization with the first clock signal in the serial data receiving operation and producing a load enable signal one of the count signals produced by the count signal producing unit in synchronization with the first clock signal in the serial data transmitting operation, wherein the reception parallel data is driven by the data converting unit in response to the load enable signal in the serial data receiving operation, and the transmission parallel data is sampled by the data converting unit in response to the load enable signal in the serial data transmitting operation.

8. A data transfer device according to claim 7, wherein the load enable signal producing unit comprises a selector for selecting the count signal relating to the production of the load enable signal from the count signals produced by the count signal producing unit according to a selection signal which is set according to a software architecture or at an external terminal.

9. A data transfer device according to claim 1, wherein the second count value of the second count signal produced by the count signal producing unit is counted after the passage of a time period corresponding to half of the prescribed clock cycle from the counting of the first count of the first count signal.

10. A data transfer device according to claim 1, wherein the count signal relating to the driving of the reception parallel data performed by the data converting unit in the serial data receiving operation is the same as the second count signal produced by the count signal producing unit, and the count signal relating to the sampling of the transmission parallel data performed by the data converting unit in the serial data transmitting operation differs from the second count signal produced by the count signal producing unit.

11. A data transfer device according to claim 1, wherein the drive timing of the data converting unit for the reception parallel data is coincident with the timing of the second edge of each pulse of the second clock signal, the reception parallel data driven by the data converting unit is sampled by the low speed operating unit in synchronization with the first edge of each pulse of the second clock signal, the transmission parallel data is driven by the low speed operating unit in synchronization with the first edge of each pulse of the second clock signal, and the sampling timing of the data converting unit for the transmission parallel data driven by the low speed operating unit is coincident with the timing of the second edge of each pulse of the second clock signal.

12. A data transfer device according to claim 1, further comprising a data holding unit for holding the transmission parallel data transferred from the low speed operating unit, wherein the data converting unit includes a shift register for receiving the transmission parallel data held in the data holding unit in response to a shift enable signal set to a first level, converting the transmission parallel data into the output serial data in response to the shift enable signal set to a second level, and transmitting the output serial data in synchronization with the first clock signal.

13. A data transfer device, comprising:
a high speed operating unit for receiving input serial data in a data receiving operation in synchronization with a first clock signal having a frequency corresponding to a high transmission speed, converting the input serial data into reception parallel data, and transmitting output serial data in a data transmitting operation in synchronization with the first clock signal; and
a low speed operating unit for receiving the reception parallel data transferred from the high speed operating unit in synchronization with a second clock signal having a frequency lower than that of the first clock signal and transferring transmission parallel data to the high speed operating unit in synchronization with the second clock signal,
wherein the high speed operating unit comprises:
a stuff bit control signal producing unit for producing a stuff bit control signal indicating the detection of a stuff bit in synchronization with the first clock signal in the serial data receiving operation in a case where a stuff bit following a prescribed number of pieces of bit-data of the input serial data successively set to a fixed value is detected, and producing a stuff bit control signal indicating the insertion of a stuff bit in synchronization with the first clock signal in the serial data transmitting operation in a case where a prescribed number of pieces of bit-data of the output serial data successively set to the fixed value is detected in the output serial data;
a count signal producing unit for circularly counting the number of pulses of the first clock signal in a count range corresponding to a prescribed clock cycle, stopping the counting so as to hold the count value recently obtained during a time period corresponding to the stuff bit according to the stuff bit control signal produced by the stuff bit control signal producing unit in both the serial data receiving operation and the serial data transmitting operation, and producing a plurality of count signals indicating count values currently obtained so as to include both a first count signal indicating a first count value and a second count signal indicating a second count value;
a clock signal producing unit for producing the second clock signal by forming a first edge of each pulse in response to the first count signal produced by the count signal producing unit in synchronization with the first clock signal and forming a second edge of each pulse in response to the second count signal produced by the count signal producing unit in synchronization with the first clock signal, and transmitting the second clock signal to the low speed operating unit; and
a data converting unit for receiving the input serial data in synchronization with the first clock signal in the serial data receiving operation, removing the stuff bit from the input serial data according to the stuff bit control signal produced by the stuff bit control signal producing unit in the serial data receiving operation, converting the input serial data into the reception parallel data in synchronization with the first clock signal, driving the reception parallel data in response to one of the count signals produced by the count signal producing unit so as to sample the reception parallel data in the low speed operating unit in synchronization with the second clock signal, sampling the transmission parallel data, which is driven by the low speed operating unit in synchronization with the second clock signal in the serial data transmitting operation, in response to one of the count signals produced by the count signal producing unit, converting the transmission parallel data into the output serial data in synchronization with the first clock signal, inserting a stuff bit just after the prescribed number of pieces of bit-data of the output serial data successively set to the fixed value according to the stuff bit control signal produced by the stuff bit control signal producing unit in the serial data transmitting operation, and transmitting the output serial data in synchronization with the first clock signal.

14. A data transfer device according to claim 13, wherein a cycle of the second clock signal produced by the clock signal producing unit is set to the prescribed clock cycle in a case where no stuff bit is detected in the serial data receiving operation by the stuff bit control signal producing unit or a prescribed number of pieces of bit-data of the output serial data successively set to the fixed value is not detected in the serial data transmitting operation by the stuff bit control signal producing unit, and a cycle of the second clock signal produced by the clock signal producing unit is set to a sum of the prescribed clock cycle and one cycle of the first clock signal in a case where a stuff bit is detected in the serial data receiving operation by the stuff bit control signal producing unit or a prescribed number of pieces of bit-data of the output serial data successively set to the fixed value is detected in the serial data transmitting operation by the stuff bit control signal producing unit.

15. A data transfer device according to claim 13, further comprising a data holding unit for holding the transmission parallel data transferred from the low speed operating unit, wherein the data converting unit comprises:

a shift register for receiving the transmission parallel data held in the data holding unit in response to a shift enable signal set to a first level, and converting the transmission parallel data into the output serial data in response to the shift enable signal set to a second level; and a stuff bit inserting unit for inserting a stuff bit just after the prescribed number of pieces of bit-data of the output serial data successively set to the fixed value according to the stuff bit control signal, and transmitting the output serial data in synchronization with the first clock signal.

* * * * *

UNITED STATES PATENT AND TRADEMARK OFFICE
CERTIFICATE OF CORRECTION

PATENT NO.     : 6,911,843 B2
DATED          : June 28, 2005
INVENTOR(S)    : Katsuya Mizumoto et al.

It is certified that error appears in the above-identified patent and that said Letters Patent is hereby corrected as shown below:

<u>Title page,</u>
Item [73], Assignee, change "Mitsubishi Electric System, Itami (JP); LSI Design Corporation, Itami (JP)" to -- Mitsubishi Electric System LSI Design Corporation, Itami (JP) --.

Signed and Sealed this

First Day of November, 2005

JON W. DUDAS
*Director of the United States Patent and Trademark Office*